US008877622B2

(12) United States Patent
Poiroux et al.

(10) Patent No.: US 8,877,622 B2
(45) Date of Patent: Nov. 4, 2014

(54) PROCESS FOR PRODUCING AN INTEGRATED CIRCUIT

(75) Inventors: Thierry Poiroux, Voiron (FR); Sébastien Barnola, Villard-Bonnot (FR); Yves Morand, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/811,792

(22) PCT Filed: Jul. 22, 2011

(86) PCT No.: PCT/FR2011/051779
§ 371 (c)(1),
(2), (4) Date: Apr. 30, 2013

(87) PCT Pub. No.: WO2012/010812
PCT Pub. Date: Jan. 26, 2012

(65) Prior Publication Data
US 2013/0252412 A1   Sep. 26, 2013

(30) Foreign Application Priority Data
Jul. 23, 2010   (FR) ..................................... 10 56070

(51) Int. Cl.
*H01L 21/3205* (2006.01)
*H01L 21/4763* (2006.01)
*H01L 21/8234* (2006.01)
*H01L 27/11* (2006.01)
*H01L 27/115* (2006.01)
*H01L 21/768* (2006.01)

(52) U.S. Cl.
CPC *H01L 21/823468* (2013.01); *H01L 21/823456* (2013.01); *H01L 27/11* (2013.01); *H01L 27/11521* (2013.01); *H01L 21/76897* (2013.01); *H01L 21/823475* (2013.01)
USPC .......................................... 438/586; 438/587

(58) Field of Classification Search
USPC .................................................. 438/586, 587
See application file for complete search history.

(56) References Cited

U.S. PATENT DOCUMENTS

| 5,120,668 A | 6/1992 | Hsu et al. |
| 5,739,573 A | 4/1998 | Kawaguchi |

(Continued)

OTHER PUBLICATIONS

A.J. Hazelton et al; Double-patterning requirements for optical lithography and prospects for optical extension without double patterning, Micro/Nanolith., MEMS MOEMS; vol. 8(1), 011003 (Jan.-Mar. 2009).

(Continued)

*Primary Examiner* — Karen Kusumakar
(74) *Attorney, Agent, or Firm* — Pillsbury Winthrop Shaw Pittman LLP

(57) ABSTRACT

A process for producing an integrated circuit on the surface of a substrate, the process including: producing a first layer, including active zones and insulating zones, on the surface of the substrate; producing gate zones on the surface of the first layer, the gate zones each being surrounded by insulating spacers; producing source/drain electrodes; producing a dielectric layer between the insulating spacers, the dielectric layer having an upper surface level with the upper surfaces of the gate zones; partially etching each gate zone so as to lower the upper surface of a first part of each gate zone; and depositing an insulating dielectric layer on the first parts of the gate zones.

12 Claims, 21 Drawing Sheets

(56) References Cited

U.S. PATENT DOCUMENTS

| | | | |
|---|---|---|---|
| 6,207,543 B1* | 3/2001 | Harvey et al. | 438/586 |
| 6,235,619 B1* | 5/2001 | Miyakawa | 438/585 |
| 2002/0072167 A1* | 6/2002 | Lee et al. | 438/201 |
| 2003/0036240 A1* | 2/2003 | Trivedi | 438/383 |
| 2004/0018707 A1* | 1/2004 | Terauchi | 438/586 |
| 2005/0090086 A1* | 4/2005 | Huh | 438/586 |
| 2007/0096212 A1 | 5/2007 | Sato et al. | |
| 2008/0290429 A1* | 11/2008 | Jeon | 257/413 |
| 2009/0155995 A1 | 6/2009 | Wei et al. | |
| 2010/0015789 A1 | 1/2010 | Moritoki | |

OTHER PUBLICATIONS

C. Bencher et al.; "22nm half-pitch patterning by CVD spacer self alignment double patterning (SADP),"; Proc. SPIE 6924, 2008.

"SAPD: the best option for <32 nm NAND flash"; Nanoship technology journal, Issue two 2007, pp. 8-13.

International Search Report as issued for PCT/FR2011/051779.

* cited by examiner

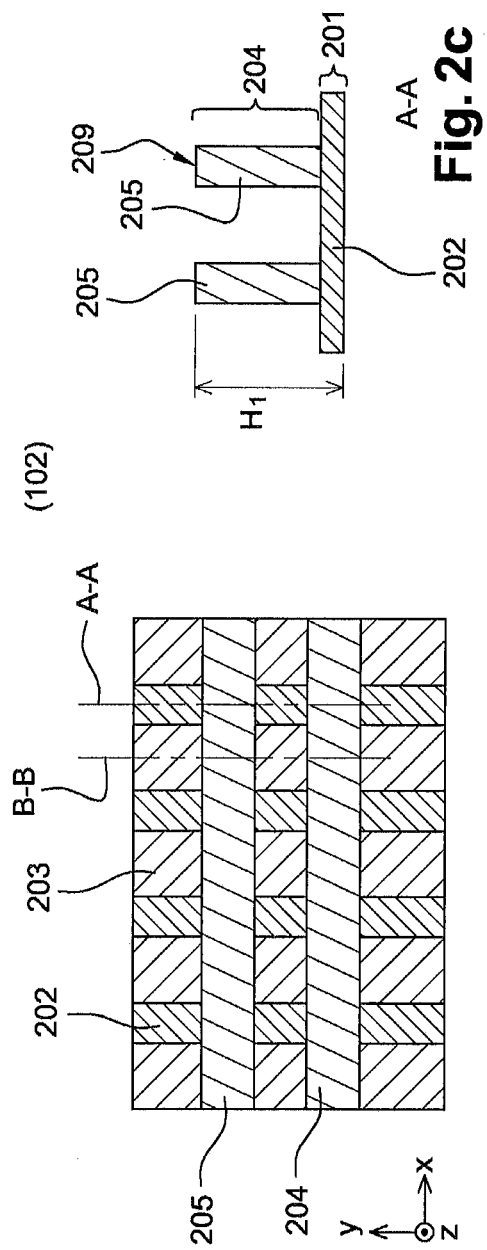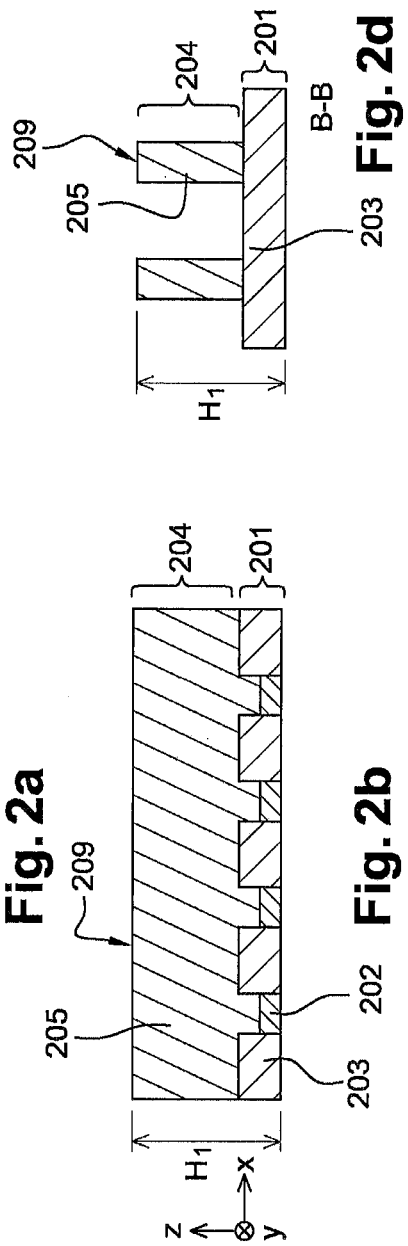

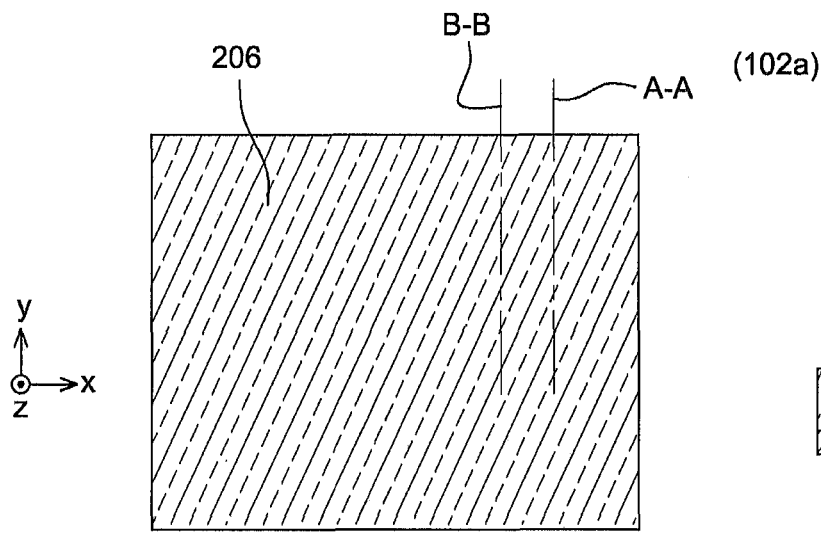
Fig. 3a
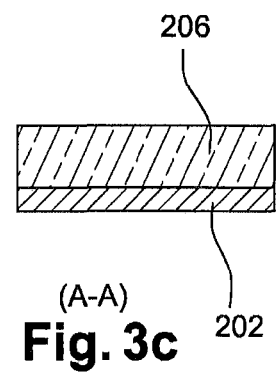
(A-A) Fig. 3c
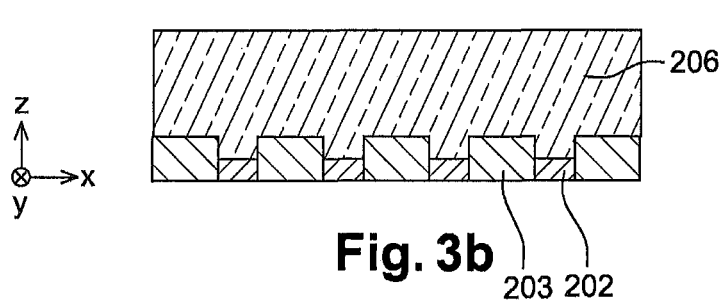
Fig. 3b
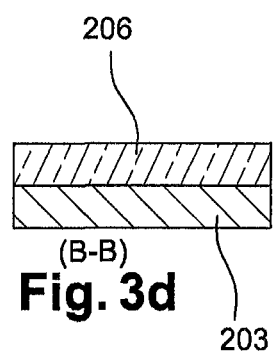
(B-B) Fig. 3d

(102b)
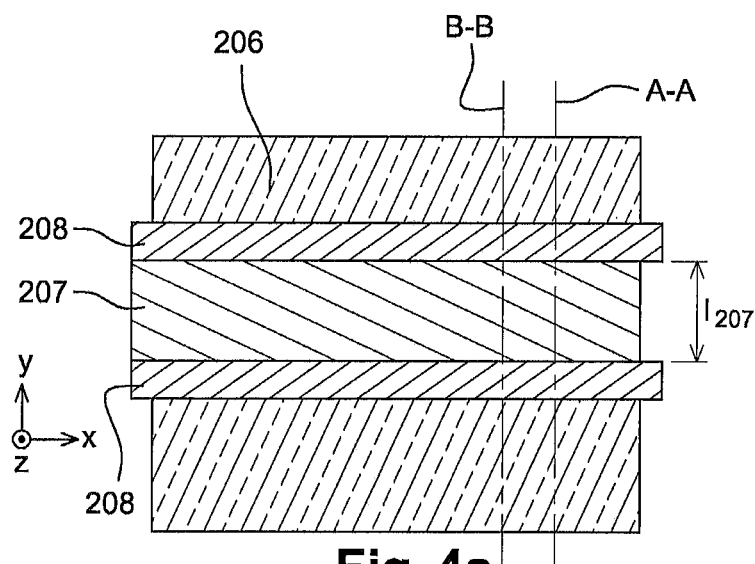
Fig. 4a
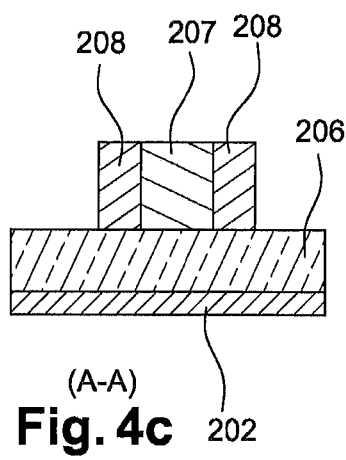
(A-A) Fig. 4c
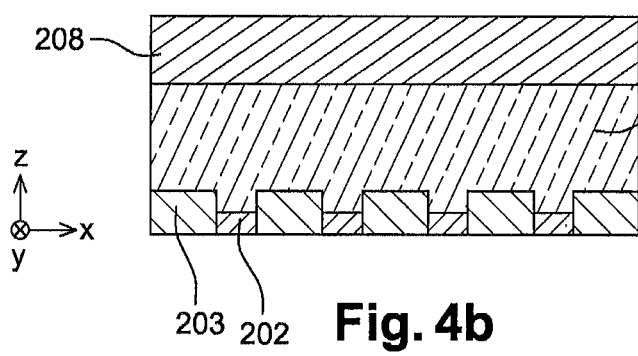
Fig. 4b
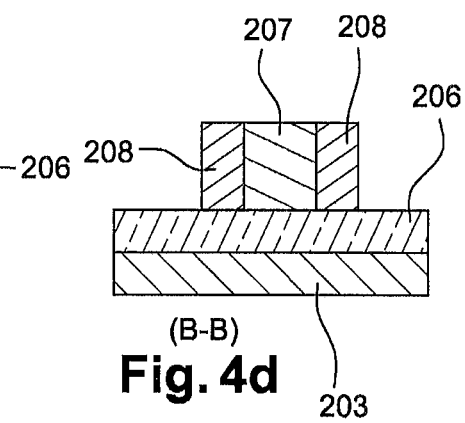
(B-B) Fig. 4d

(A-A)

(B-B)

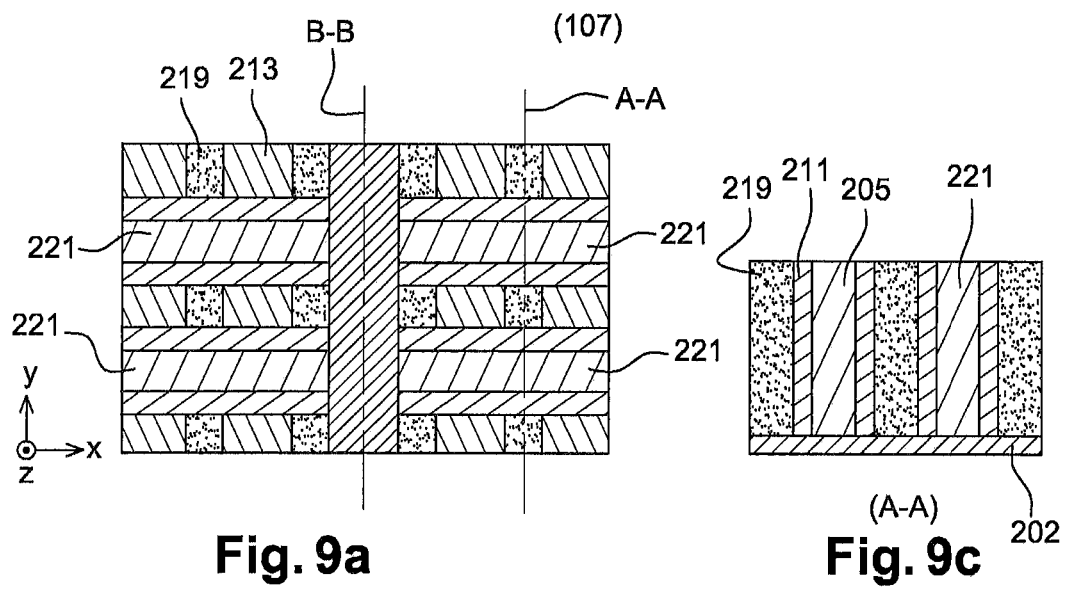
Fig. 9a
Fig. 9c
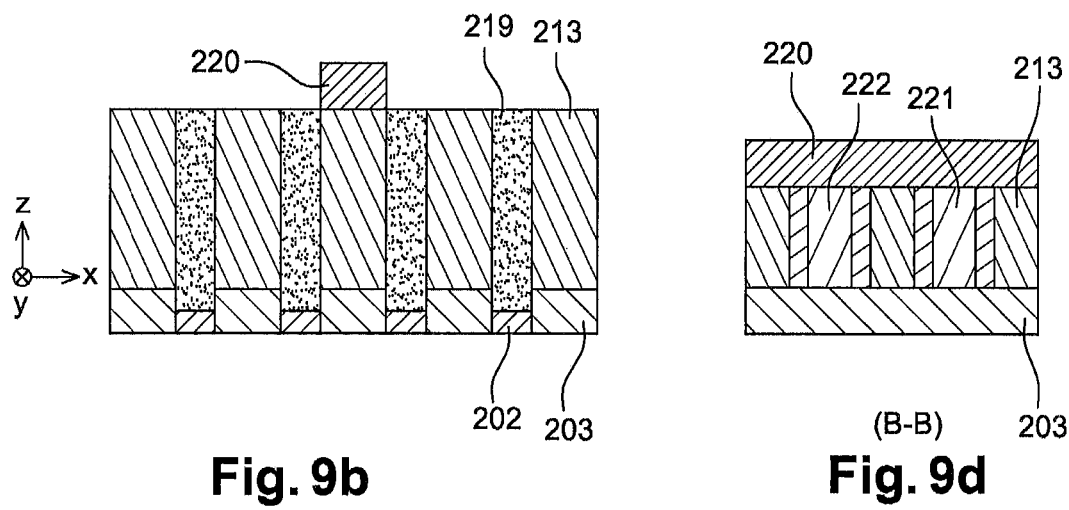
Fig. 9b
Fig. 9d

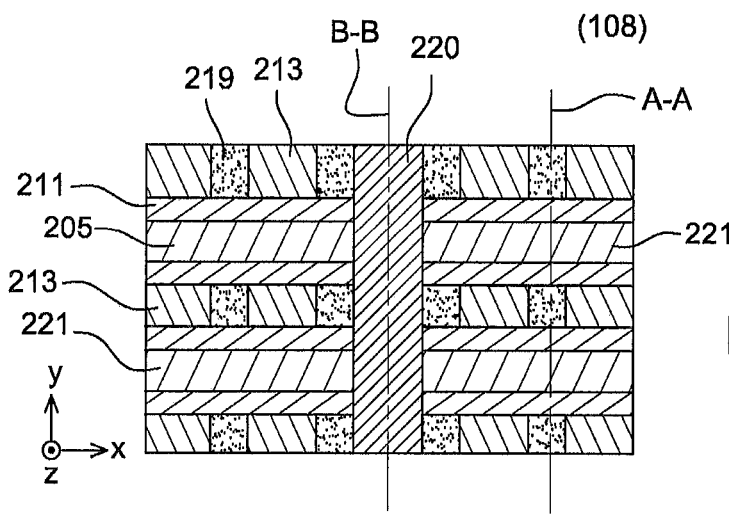
Fig. 10a
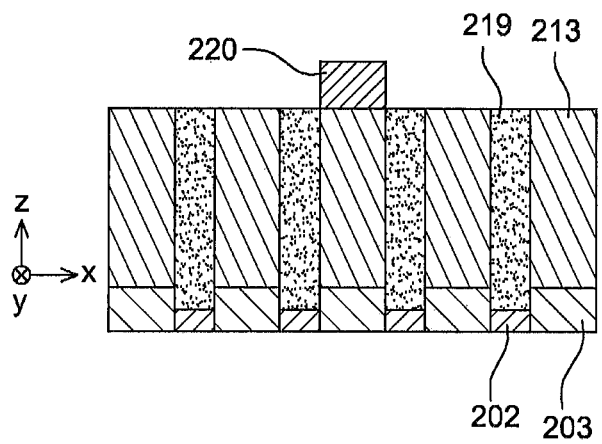
Fig. 10b
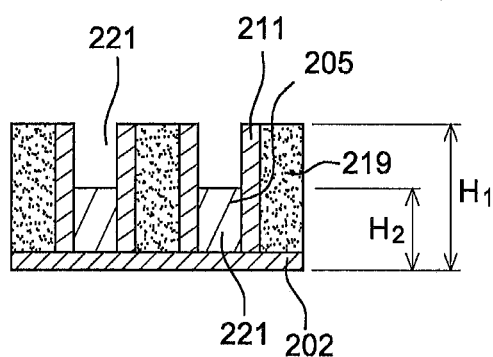
(A-A) Fig. 10c
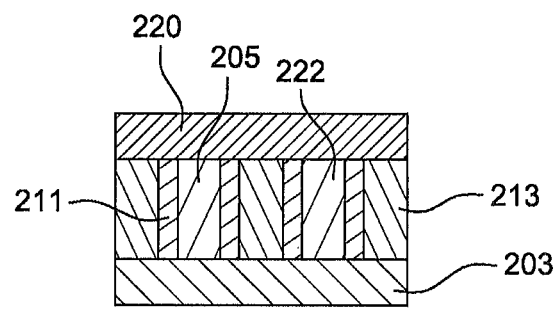
(B-B) Fig. 10d

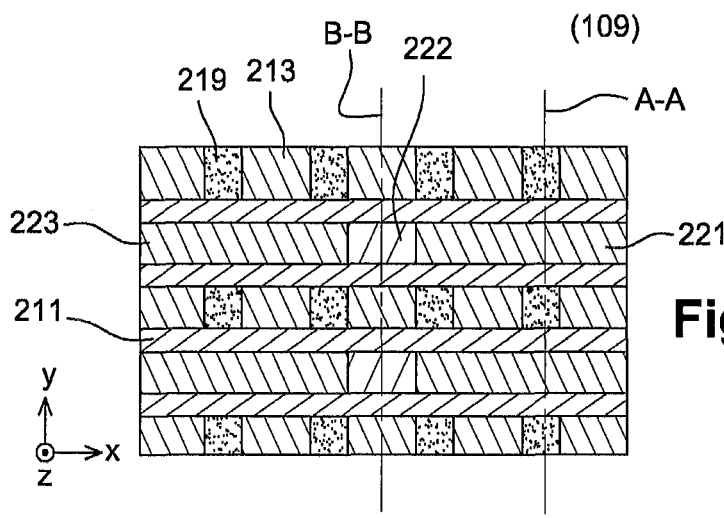
Fig. 11a
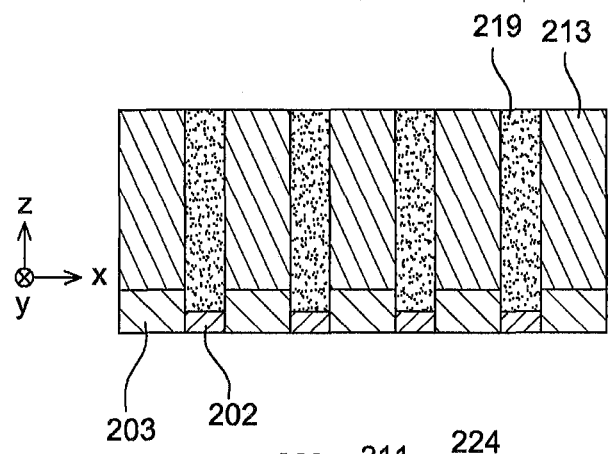
Fig. 11b
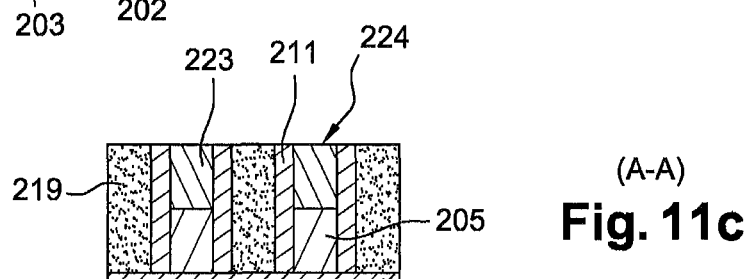
(A-A) Fig. 11c
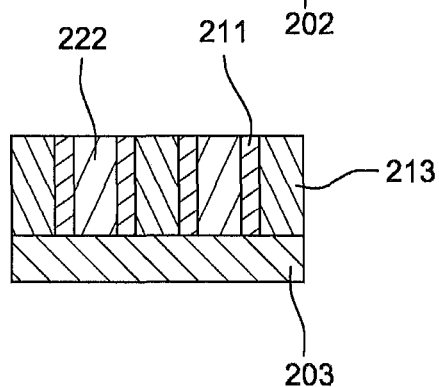
(B-B) Fig. 11d

A-A

B-B

C-C

A-A

B-B

C-C

PROCESS FOR PRODUCING AN INTEGRATED CIRCUIT

CROSS-REFERENCE TO RELATED APPLICATIONS

This is the U.S. National Stage of PCT/FR2011/051779, filed Jul. 22, 2011, which in turn claims priority to French Patent Application No. 1056070, filed Jul. 23, 2010, the entire contents of all applications are incorporated herein by reference in their entireties.

TECHNICAL FIELD OF THE INVENTION

The present invention relates to a method for producing an integrated circuit.

PRIOR ART

The evolution of integrated circuits leads to a constant reduction in the dimensions of these integrated circuits, and to an increase in their density. Currently, "double patterning" or "spacer patterning" techniques enable integrated circuits to be produced with a pitch that is is twice as low as those produced by conventional lithography techniques. These "double patterning" and "spacer patterning" type techniques are for example described in the documents titled "Double-patterning requirements for optical lithography and prospects for optical extension without double patterning," A. J. Hazelton et al, J. Micro/Nanolith., MEMS MOEMS 8, 2009 and "22 nm half-pitch patterning by CVD spacer self alignment double patterning (SADP)," C. Bencher et al., Proc. SPIE 6924, 2008.

However, the reduction in the dimensions of integrated circuits is accompanied by level to level alignment specifications that are increasingly difficult to reach. This alignment specification is extremely difficult to keep when the gate zones and contacts are produced by "double patterning" or "spacer patterning." In fact, in these techniques, different masks are positioned and then removed to produce different integrated circuit levels (active zone contact, gate zones, gate contact, etc.). The removal of various masks leads to inaccuracies in the relative positions, particularly between the contacts and gate zones.

The prior art knows different methods enabling the accuracy of the relative positions between contacts and gate zones to be improved. Therefore, document US2010/0015789 describes a method of producing integrated circuits in which the gate zones are partially etched and then protected by an insulating material near the active zone contacts. Opening contact holes in active zones tolerates contact lithography removal with relation to the gates, since the contact etching is stopped in the insulating material situated over the gates. Nevertheless, as in a conventional architecture, to define two contacts that are electrically isolated from each other in active zones situated on both sides of a gate zone, two separate contact holes should be defined in lithography.

Document US2009/0155995 describes a method of producing integrated circuits in which the active zone contacts are flush with a stack comprising a non-volatile memory gate stack covered by an insulating hard mask. The described method does not enable gate contacts to be produced in a self-aligned manner with relation to the gates. In addition, this method is not compatible with a "gate last" type approach.

DISCLOSURE OF THE INVENTION

The invention aims to remedy the disadvantages from the prior art by proposing a method to produce an integrated circuit.

Another object of the invention is to propose a method of producing an integrated circuit in which the active zone contacts and the gate contacts are perfectly aligned with relation to the gates.

Another object of the invention is to propose a production method that enables integrated circuits with technology nodes of less than 22 nm to be produced.

Another object of the invention is to propose an integrated circuit production method enabling a "gate first" or "gate last" type approach.

Another object of the invention is to propose a method that enables all types of transistors to be produced.

To do this, according to a first aspect of the invention, a method of producing an integrated circuit on the surface of a substrate is proposed, the method comprising the following steps:
(a) producing a first layer comprising active zones and insulating zones on the surface of the substrate;
(b) producing gate zones on the surface of the first layer, the gate zones presenting upper surfaces substantially at the same level;
(c) producing insulating spacers that surround each of the gate zones, the insulating spacers presenting upper surfaces at the same level as the upper surfaces of the gate zones;
(d) producing a dielectric layer between the insulating spacers, the dielectric layer presenting an upper surface level with the upper surfaces of the gate zones produced in step (b);
(e) partially etching each gate zone so as to lower the upper surface of a first part of each gate zone, a second part of each gate zone maintaining the level of its upper surface, the second part of each gate zone forming a gate contact;
(f) depositing an insulating dielectric layer on the first parts of the gate zones.

The method according to the invention is thus particularly remarkable in that the gate zones produced in step (b), the insulating spacers, the dielectric layer produced in step (c), and the gate contacts present upper surfaces that are all substantially at the same level, i.e., that these surfaces are aligned, or else that they are all situated at the same height. In this way, the gate contacts are directly produced from gate zones produced in step (b) and therefore these gate contacts are self-aligned on the gate zones.

Advantageously, the method according to the invention also comprises a step of planarizing the insulating dielectric layer such that it presents an upper surface that is aligned with the upper surface of the dielectric layer.

The method according to the invention also preferably comprises the following steps:
(g) selective etching of the dielectric layer so as to dig trenches in the dielectric layer, the trenches being situated over the active zones;
(h) filling the trenches with a conductive material so as to produce active zone contacts.

According to the invention, active zone contacts therefore present upper surfaces that are substantially at the same level as the upper surfaces of gate zones produced in step (b).

Advantageously, the trenches extend along a direction that is secant to the direction along which the gate zones and at least part of the insulating spacers extend.

The active zone contacts are therefore defined on the one hand by trenches dug into the dielectric layer, and on the other hand by the part of the insulating spacers that extend along a direction secant to the direction of the trenches.

In this way, the active zone contacts are self-aligned with relation to the gate zones. In fact, the thickness of the insulating spacers that surround the gate zones may be controlled very precisely. Consequently, the position of active zone contacts is defined very precisely with relation to the gate zones.

Depending on different embodiments:
steps (g) and (h) may be produced before steps (e) and (f) or,
steps (e) and (f) may be produced before steps (g) and (h).

The active zones and the insulating zones preferably extend along a longitudinal direction, and the gate zones produced in step (b) preferably extend along a transverse direction perpendicular to the longitudinal direction. At least one part of the insulating spacers also preferably extends along the transverse direction.

Advantageously, the trenches produced in step (g) each comprise two lateral walls that extend along the longitudinal direction. Each active zone contact is defined on the one hand by the lateral walls of one of the trenches and on the other hand by two of the insulating spacers that extend along the transverse direction and that traverse said trench. The active zone contacts produced in step (h) therefore present in top view a section in rectangular or square form.

Advantageously, step (b) comprises:
a step of depositing a gate stack on the surface of the first layer, the gate stack presenting an upper surface situated at a height equal to the height the upper surfaces of the gate contacts and the active zone contacts will have;
a step of defining the gate zones in the gate stack by etching.

The method according to the invention may be used both in the context of a "gate first" approach and in the context of a "gate last" approach. In the case of a "gate first" type approach, the gate zones produced in step (b) are directly produced in the gate stack that will constitute the gate zones in the final integrated circuit. The gate stack chosen to produce the gate zones in step (b) is for example constituted of:
a high-k, dielectric material;
titanium nitride;
doped polysilicon.

High-k materials or dielectric materials with a high dielectric constant may be defined as material with a dielectric constant k strictly greater than 3.9. In this instance, the high-k material that may be used here is for example $HfO_2$ that presents a dielectric constant close to 20-25.

In the case of a "gate last" type approach, the gate zones produced in step (b) are produced in a sacrificial stack, and the method also comprises, following step (d), a step of replacing the sacrificial stack with a final gate stack. The sacrificial stack used in step (b) may for example be constituted of:
an oxide that will be used as a barrier layer during etching of the gate zones;
a false gate material, for example polysilicon.

In the case of a "gate last" type approach, following deposition of the dielectric layer in step (d), the sacrificial stack is eliminated by etching, and then a new gate stack is deposited between the insulating spacers. This new gate stack may for example be constituted of:
a high-k dielectric material;
titanium nitride; and
doped polysilicon.

Advantageously, step (c) comprises the following steps:
deposition of a uniform layer on the surface of the first layer and gate zones that cover it;
etching the horizontal parts of the uniform layer, to only keep the vertical parts of the uniform layer. The uniform parts of the uniform layer embrace the lateral walls of the gate zones and constitute the insulating spacers.

The insulating spacers protect all of the lateral walls of the gate zones. When the gate zones only present two lateral walls that extend along the transverse direction, all the insulating spacers extend along the transverse direction. When the gate zones also comprise lateral walls that extend along the longitudinal direction, some insulating spacers also extend along the longitudinal direction.

The uniform layer deposited in step (c) preferably is a dielectric layer. This layer is, for example, constituted to of nitride, or may be an oxide/nitride bilayer.

Advantageously, step (d) comprises the following steps:
depositing a dielectric layer;
polishing the dielectric layer such that the upper surface is level with the upper surfaces of the gate zones.

The dielectric layer may, for example, be constituted of silica.

Advantageously, step (e) comprises the following steps:
depositing a second protective mask that defines the lines of protection extending along the longitudinal direction, the lines of protection protecting the second parts of the gate zones;
partially etching the gate zones through the second protective mask so as to lower the height of the first parts of the gate zones that are not protected by the lines of protection,
removing the second protective mask.

The step of partially etching the stack is a step of selectively etching the material that constitutes the gate zones. During this etching step, the dielectric layer, protective mask and insulating spacers are not modified by the partial etching.

The partial etching of the gate zones so as to lower the height of the gate zones may be carried out by:
either controlling the time during which the gate zones are etched. In this case, the partial etching is stopped when the desired quantity is removed from the gate zones;
or, when the gate zones are constituted of a stack of several different layers, by selectively etching the upper layer or layers of this gate stack.

Therefore, according to the invention, the gate zones are first produced in step (b) with a height that is as high as that of the gate contacts and active zone contacts, and then the height of some parts of these gate zones is lowered, while other parts of the gate zones maintain their initial height so as to form gate contacts.

The parts of the gate zones in which the height has been lowered are then covered by an insulation layer that prevents short-circuits. The upper surface of the insulation layer is preferably level with the upper surface of the dielectric layer.

Advantageously, the insulation layer is made in a material different from the material in which the dielectric layer is made. In this way, during the step of etching trenches in the dielectric layer, the insulation layer situated on some parts of the gate zones remains intact.

Advantageously, the method according to the invention also comprises a step of producing electrodes on the active zones.

Advantageously, this step of producing electrodes on the active zones takes place between steps (c) and (d).

Advantageously, this step of producing electrodes on the active zones comprises:

a lithography step enabling the electrodes to be defined;
a step of doping the active zones by implanting chemical species in the active zones,
a step of activating the steps for activating the species implanted in the active zones by annealing and
a siliconizing step.

The invention also relates to an integrated circuit produced by the method according to the invention, and more particularly an integrated circuit presenting technology nodes of less than 22 nm such as defined by the ITRS (International Technology Roadmap for Semiconductor) produced by the method according to the invention, and still more preferentially an integrated circuit presenting technology nodes of less than 11 nm produced by the method according to the invention.

BRIEF DESCRIPTION OF THE FIGURES

Other characteristics and advantages of the invention will emerge upon reading the following description, with reference to the attached figures, that illustrate:

FIGS. 2a, 2b, 2c, 2d represent, respectively in top view, side view and cross sectional view, the second step of the method from FIG. 1;

FIGS. 3a, 3b, 3c, 3d represent, respectively in top view, side view and cross sectional view, a first sub-step of the second step of the method from FIG. 1;

FIGS. 4a, 4b, 4c, 4d represent, respectively in top view, side view and cross sectional view, a second sub-step of the second step of the method from FIG. 1;

FIGS. 9a, 9b, 9c, 9d represent, respectively in top view, side view and cross sectional view, the seventh step of the method from FIG. 1;

FIGS. 10a, 10b, 10c, 10d represent, respectively in top view, side view and cross sectional view, the eighth step of the method from FIG. 1;

FIGS. 11a, 11b, 11c, 11d represent, respectively in to top view, side view and cross sectional view, the ninth step of the method from FIG. 1;

FIGS. 13a, 13b, 13c, 13d represent, respectively in top view, side view and cross sectional view, the second step of the method from FIG. 12a;

FIGS. 14a, 14b, 14c, 14d represent, respectively in top view and cross sectional view, the third step of the method from FIG. 12a;

FIGS. 15a, 15b, 15c, 15d represent, respectively in top view and cross sectional view, the third step of the method from FIG. 12a;

FIGS. 16a, 16b, 16c, 16d represent, respectively in top view and cross sectional view, the fourth step of the method from FIG. 12a;

FIGS. 17a, 17b, 17c, 17d represent, respectively in top view and cross sectional view, the fifth step of the method from FIG. 12a;

FIGS. 18a, 18b, 18c, 18d represent, respectively in top view and cross sectional view, the sixth step of the method from FIG. 12a;

FIGS. 19a, 19b, 19c, 19d represent, respectively in top view and cross sectional view, the seventh step of the method from FIG. 12a;

FIGS. 20a, 20b, 20c, 20d represent, respectively in top view and cross sectional view, the eighth step of the method from FIG. 12a;

FIGS. 21a, 21b, 21c, 21d represent, respectively in top view and cross sectional view, the ninth step of the method from FIG. 12a;

FIGS. 22a, 22b, 22c, 22d represent, respectively in top view and cross sectional view, the tenth step of the method from FIG. 12a;

For more clarity, identical or similar elements are marked by identical reference signs in all of the figures.

DETAILED DESCRIPTION OF AT LEAST ONE EMBODIMENT

FIGS. 1a to 11d schematically represent the steps of a method according to the invention in the context of the production of an integrated circuit of the non-volatile memory plane type presenting a technology node of 11 nm. In fact, although the method according to the invention may be used to produce integrated circuits in all dimensions, the method according to the invention is particularly well suited for producing these integrated circuits presenting technology nodes at 22 nm, and in particular, less than or equal to 11 nm.

Figure 1A:
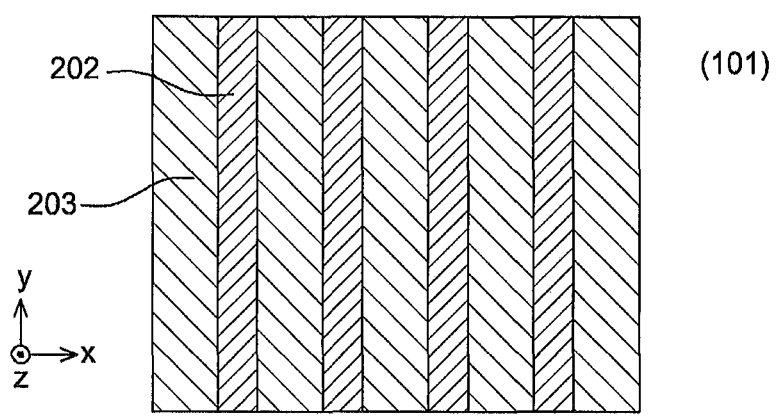
FIGS. 1a and 1b represent, respectively in top view and side view, the first step of a method according to the invention enabling an integrated circuit of the non-volatile memory plane type presenting a technology node of 11 nm to be manufactured.
Figure 1B:
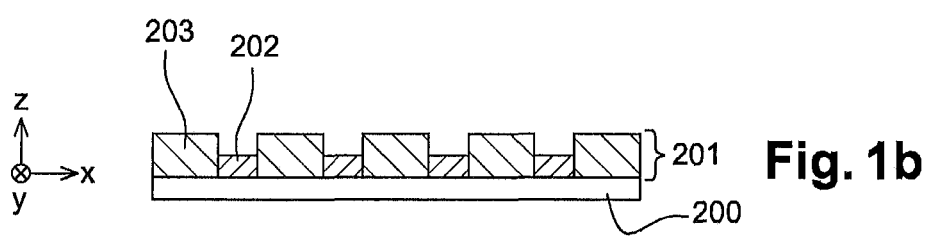

The first step 101 of the method, represented in FIGS. 1a and 1b, consists of producing a first layer 201 on a substrate 200. The first layer 201 comprises several active zones 202 separated by insulating zones 203 between them. These active zones 202 are preferably made of monocrystalline silicon. The insulating zones 203 are formed by a dielectric material that is, for example, silicon oxide. Active zones 202 and insulating zones 203 each form a line that extends along a longitudinal direction. The longitudinal direction is parallel to the Y axis.

Methods of manufacturing such a first layer 201 are known from the prior art. One may for example make such a first layer 201 from an SOI (or silicon on insulator) type substrate or from a "bulk" type silicon substrate. When the first layer 201 is made from a silicon substrate, one may, for example, use the following steps:

an oxide layer is deposited on the surface of the substrate. This oxide layer will be used subsequently as a base interface layer between the gate zones and the substrate;
a layer of nitride is deposited on the oxide layer;
the oxide and nitride layers, as well as the upper surface of the silicon substrate, are etched so as to define trenches that separate the active zones 202. These active zones are constituted of the upper surface of the silicon substrate. This etching step may be carried out by conventional lithography, by double patterning or by spacer patterning;

the trenches are filled with an oxide so as to produce insulating zones 203. The upper surface of the insulating zones is then planarized, for example by chemical-mechanical polishing;

the nitride layer is then eliminated.

The result obtained at the end of this step is represented in FIGS. 1a and 1b.

The second step 102, represented in FIGS. 2a to 2c, consists of producing a second layer 204 on the first layer 201 that comprises several gate zones 205. Each of these gate zones 205 forms a line that extends along a transverse direction perpendicular to the longitudinal direction. The transverse direction is parallel to the X axis. The method according to the invention is particularly remarkable in that each gate zone presents an upper surface situated at a height H1 that is equal to the height at which the upper surfaces of each of the integrated circuit contacts will be situated. "Height H1" is understood to refer to a dimension along the Z axis. Height H1 is taken between the upper surface of the substrate 200 and an upper surface 209 of the gate zones. Consequently, the method according to the invention is particularly remarkable in that the gate zones 205, obtained at the end of this step, are higher than the gate zones usually obtained at the end of this step 102.

The gate zones may be produced in different ways, particularly as a function of the appropriate integrated circuit dimensions. In fact, when integrated circuits are produced in conformance with fairly high technology nodes (for example in conformance with a technology node greater than 32 nm), the gate zones may be produced by conventional photolithography. In this case, a gate stack is deposited on the first layer 201. A mask that defines the form of the gate zones is then deposited over this gate stack, and the gate stack is then insolated through the mask. The insolated parts of the gate stack are then eliminated by using a suitable solvent.

When the integrated circuit that one seeks to produce with the method according to the invention is in conformance with a low technology node (for example a technology node of less than 32 nm), the gate zones may be produced by double patterning or spacer patterning techniques. The double patterning technique is known to the person skilled in the art and is for example described in the publication entitled "22 nm Half pitch patterning by CVD Spacer Self Alignment Double patterning" by Christopher Bencher et al, Proc. SPIE 6924, 2008 or in the publication entitled "Double-patterning requirements for optical lithography and prospects for optical extension without double patterning," A. J. Hazelton et al, J. Micro/Nanolith., MEMS MOEMS 8, 2009.

This double patterning technique consists of performing two photolithography steps to produce a single level. In fact, according to this method, a first photolithography step is performed to define one pattern out of two, and then a second photolithography step is performed to define the remaining patterns. This technique enables patterns with a resolution that is two times higher than with conventional lithography techniques to be produced.

When double patterning lithography is used to produce gate zones, a gate stack is deposited on the first layer 201, and then the gate zones are defined in this gate stack in two steps:

During a first step, a first mask that defines one gate zone out of two is deposited on the gate stack, and then the gate stack is insolated so as to define one gate zone out of two.

During a second step, a second mask that defines the remaining gate zones is deposited on the gate stack, and then the gate stack is insolated again so as to define the remaining gate zones.

Parts of the insolated gate stack are then eliminated thanks to a suitable solvent such that only the parts of the gate stack that form the gate zones are maintained on the surface of the first layer 201. The double patterning technique therefore enables gate zones to be defined with a resolution that is two times higher than with a conventional lithography technique.

To produce gate zones in integrated circuits that are in conformance with low technology nodes, a spacer lithography technique or spacer patterning may also be used. This spacer patterning technique, known to the person skilled in the art, is explained in further detail, for example in the publication entitled "SAPD: the best option for <32 nm NAND flash, Issue two 2007, Nanoship technology journal." The production of gate zones by a spacer patterning technique will be explained in further detail with reference to FIGS. 3a to 4d.

During a first step 102a, represented in FIGS. 3a to 3d, a gate stack 206 is uniformly deposited on the first layer 201.

During a second step 102b, represented in FIGS. 4a to 4d, a first protective mask 207 is deposited on the surface of the gate stack. This first protective mask 207 comprises patterns that form lines that extend along the transverse direction and that are therefore parallel to the X axis. The first protective mask 207 comprises two times fewer lines than the gate zones to be produced. Each pattern of the protective mask 207 presents a width $l_{207}$ along the Y axis equal to the distance that one wishes to obtain between two consecutive gate zones 205.

The first protective mask 207 may be produced in resin or in hard mask, for example in SiN.

The steps to produce this first protective mask 207 are known from the prior art. For example, a uniform layer of resin or hard mask may be deposited on the gate stack 206, and then the patterns of the first protective mask 207 may be defined, for example by lithography (optical or electronic).

Then protective spacers 208 may be produced on both sides of each pattern from the first protective mask 207. This step is represented in FIGS. 4a to 4d. Techniques for producing protective spacers 208 are also known from the prior art, for example from the document "SAPD: the best option for >32 nm NAND flash," Issue two 2007, Nanochip Technology Journal. For example, the protective spacers 208 may be produced by performing the following steps:

a homogeneous hard mask layer is deposited on the first protective mask 207;

the homogeneous layer is anisotropically etched so as to keep only the vertical parts of the homogeneous layer that form the protective spacers 208.

The protective spacers 208 are preferably made of an insulating material, for example oxide or nitride. Protective spacers 208 thus form a hard mask that will enable the gate stack 206 to be etched to form gate zones 205.

Next the first protective mask 207 is selectively eliminated, for example by selective etching, and then the gate stack 206 is selectively etched so as to eliminate all the parts of the gate stack that are not covered by protective spacers 208. This etching step is carried out, for example by anisotropic plasma, and is stopped before the first layer 201 is reached, so as to not damage the first layer 201.

The protective spacers 208 are then etched so as to eliminate them.

At the end of this step 102b, a first layer 201 covered by a second layer 204 is thus obtained. The second layer 204 is composed of gate zones 205 that form, according to this embodiment, lines that extend along the transverse direction and that are therefore parallel to the X axis. In this embodiment, each gate zone 205 therefore presents a flat upper surface 209 and a lower surface 210 that follows the form of the upper surface of active zones 202 and the upper surface of insulating zones 203. Each gate zone comprises two lateral walls 212 that extend along the transverse direction.

The method according to the invention is suitable for both a "gate first" and "gate last" type approach.

In a "gate first" type approach, each gate zone 205 is directly produced in the gate stack that will constitute the gate zones 205 in the final integrated circuit. For example, if the gate zones 205 of the final integrated circuit should be constituted of:
  a layer of high-k dielectric material;
  a layer of titanium nitride and
  a layer of doped polysilicon,
then the gate stack deposited in step 102 is directly constituted of these materials.

On the contrary, if a "gate last" type approach is used, gate zones 205 will be produced, at the end of step 102, in a sacrificial stack. In this case, gate stack 206 deposited in step 102 will be constituted of this sacrificial stack. The sacrificial stack may for example be constituted of:
  a layer of oxide that will be used as the barrier layer when etching gate zones 205, and that will enable the first layer 201 to not be damaged, and
  a false gate material, for example polysilicon.

Figure 5A:
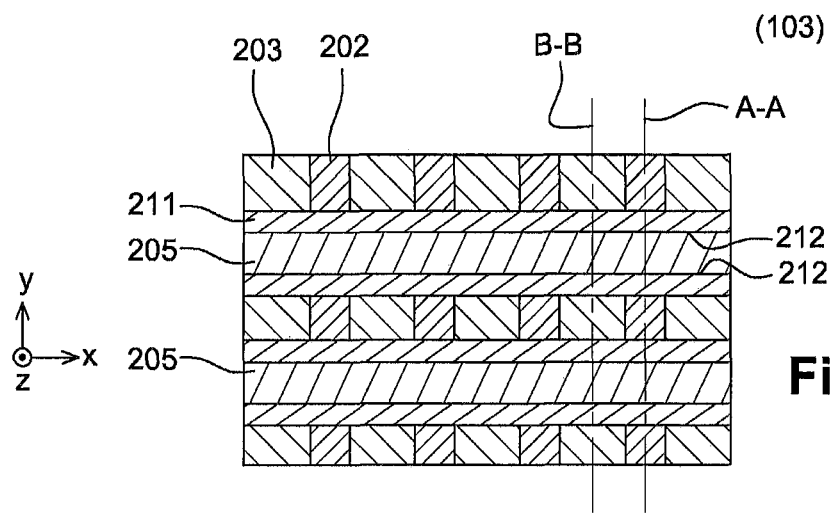
FIGS. 5a, 5b, 5c, 5d represent, respectively in top view, side view and cross sectional view, the third step of the method from FIG. 1.
Figure 5B:
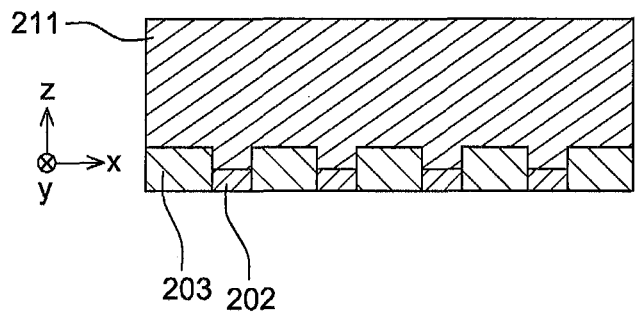
Figure 5C:
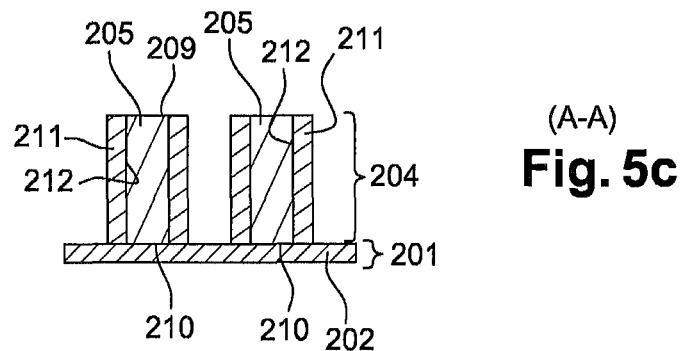
Figure 5D:
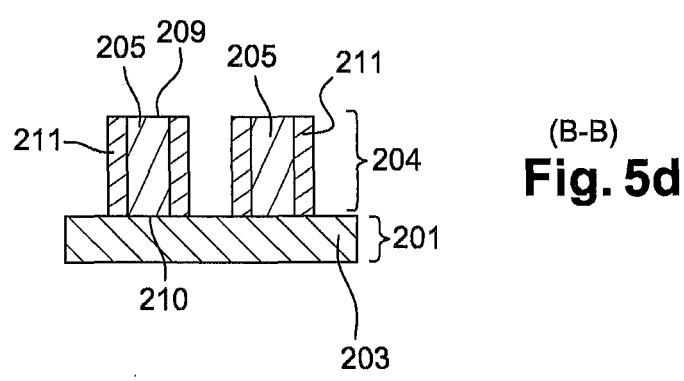

The method according to the invention then comprises a step 103 of producing insulating spacers 211 on each side of each gate zone 205. This step is represented in FIGS. 5a to 5b. More specifically, each gate zone 205 has two lateral walls 212 and each lateral wall 212 of each gate zone 205 is completely covered by an insulating spacer 211. In this embodiment, the insulating spacers 211 therefore all extend along the transverse direction. Each insulating spacer 211 is formed of a dielectric material, that may for example be a nitride or an oxide/nitride bilayer. All insulating spacers 211 may be constituted of the same material, or they may be made of different materials.

Methods enabling insulating spacers 211 to be made are known from the prior art. For example, insulating spacers 211 may be made in the following manner:
  a layer of insulating material making up the insulating spacers 211 (for example nitride or a nitride-oxide bilayer) is deposited on all of the gate zones 205 and on the first layer 201;
  the insulating material layer is anisotropically etched such that the vertical parts of the insulating material layer are kept and the horizontal parts of the insulating material layer are eliminated. The vertical parts of the insulating material layer then form insulating spacers 211 on both sides of each gate zone.

The upper surface of the insulating spacers 211 may then be planarized so that they are aligned with the upper surfaces of the gate zones. Each step may for example be carried out by Chemical-Mechanical Polishing.

Insulating spacers 211 enable the gate zones to be insulated from the active zone contacts that will be subsequently produced.

The method may, at this stage, possibly comprise additional steps, such as for example, active zone doping steps or epitaxy steps enabling the active zones to be grown. These steps are in conformance with those usually used in methods from the prior art to increase the performance of the transistors produced.

The active zones 202 are then preferably silicided so as to reduce the resistance of these zones. Siliconizing is known from the prior art. Siliconizing corresponds to the metallization of active zones 202 by chemical reaction between the silicon that makes up the active zones 202 and a metal (for example nickel) so as to form areas of low resistivity.

The method according to the invention then comprises a step 104, represented in FIGS. 6a to 6d, of depositing a dielectric layer 213. The dielectric material used to form the dielectric layer may for example be silica $SiO_2$.

This step 104 first of all comprises a step of depositing a dielectric layer 213 such that it covers all gate zones 205, and then a Chemical-Mechanical Polishing step so that the upper surface 214 of the dielectric layer is aligned with the upper surface 215 of gate zones 205. At the end of this step, the space between the insulating spacers 211 is entirely filled by the dielectric layer. The method according to the invention is therefore particularly remarkable with relation to methods from the prior art since, at the end of this step 104, the upper surface 214 of the dielectric layer is level with the upper surface of the gate zones, while in the methods from the prior art, the gate zones were lower than the dielectric layer.

When a "gate last" type approach is chosen, i.e., when gate zones 205 are produced in a sacrificial stack in step 102, the sacrificial stack that provisionally constitutes the gate zones 205 is replaced at this stage with the final stack that will form the gate zones in the final integrated circuit. To do this, the method according to the invention first of all comprises a step of selectively etching the gate zones made in step 102 of the sacrificial stack, and then a step of depositing the final gate stack in the space left free between insulating spacers 211.

The method according to the invention then comprises a step 105 of producing trenches 216 in the dielectric layer 213 so as to make the active zones 202 accessible from the upper surface 214 of the dielectric layer (FIGS. 7a to 7d). These tranches 216 extend along the longitudinal direction, i.e., they are perpendicular to gate zones 205 and to insulating spacers 211.

These trenches 216 may be produced by using techniques known from the prior art. For example, a spacer patterning technique may be used to produce these trenches 216, i.e., a first series of masks that extend along the Y direction is deposited and protective spacers are produced on both sides of each mask that also extend along the Y direction, but that present a density that is twice as high as that of the masks. Next the masks are etched so that only the protective spacers are maintained on the surface of the dielectric layer 213. The protective spacers are then used as masks and they protect the part of the dielectric layer 213 that will be maintained. The part of the dielectric layer that is not protected by the protective spacers is then eliminated, for example by anisotropic plasma etching. The part of the dielectric layer that is removed at the end of this step corresponds to the parts of the dielectric layer that are found at the top of the active zones.

Therefore, at the end of this step 105, the dielectric layer is cut with trenches 216 that connect the active zones 202 to the upper surface 214 of the dielectric layer 213. During this step 105, the gate zones 205 and the insulating spacers remain intact, then an etching that is selective and that only attacks the dielectric layer 213 is chosen.

Figure 6A:
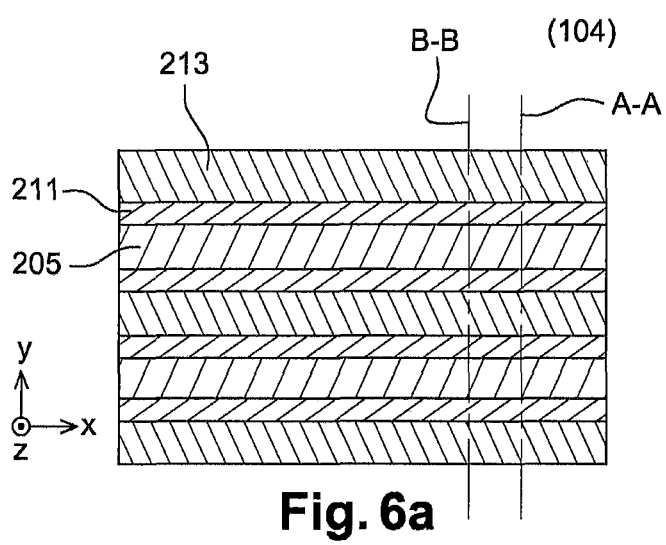
FIGS. 6a, 6b, 6c, 6d represent, respectively in top view, side view and cross sectional view, the fourth step of the method from FIG. 1.
Figure 6C:
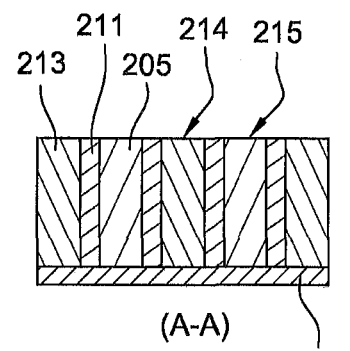
Figure 6B:
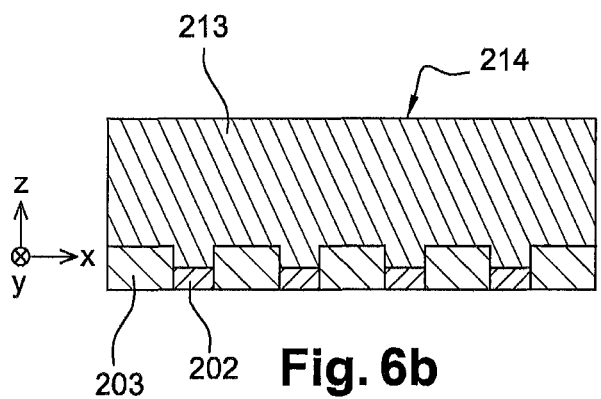
Figure 6D:
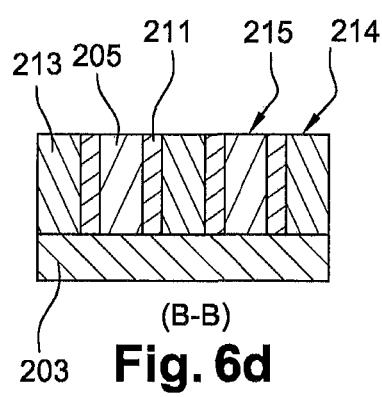
Figure 7A:
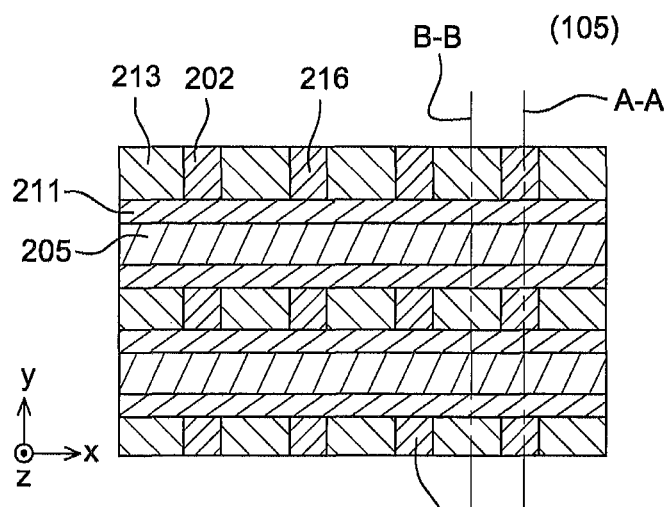
FIGS. 7a, 7b, 7c, 7d represent, respectively in top view, side view and cross sectional view, the fifth step of the method from FIG. 1.
Figure 7C:
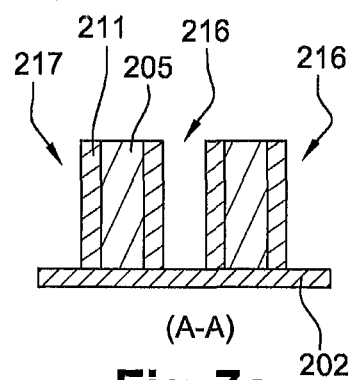
Figure 7B:
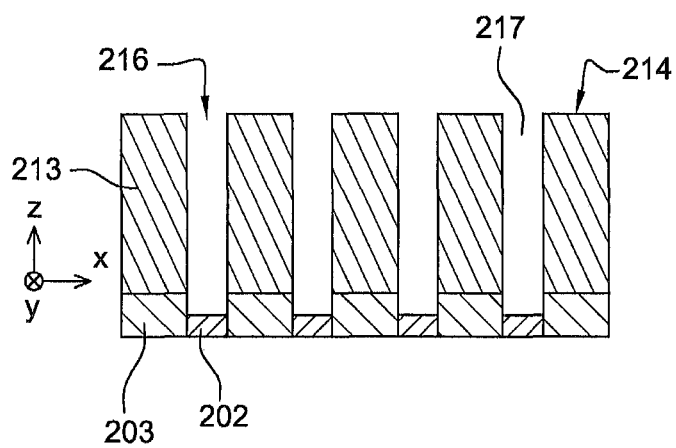
Figure 7D:
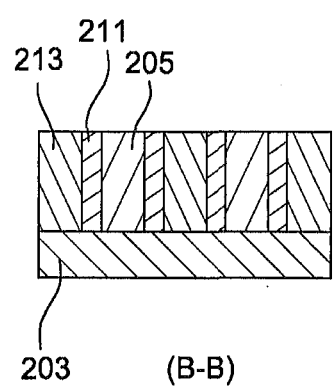
Figure 8A:
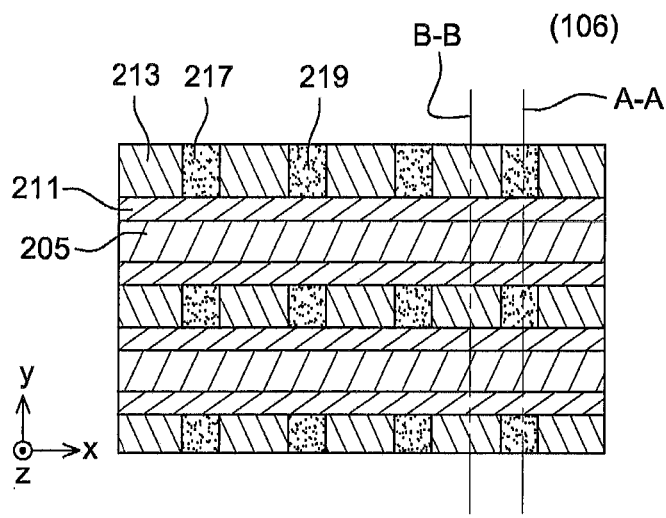
FIGS. 8a, 8b, 8c, 8d represent, respectively in top view, side view and cross sectional view, the sixth step of the method from FIG. 1.
Figure 8C:
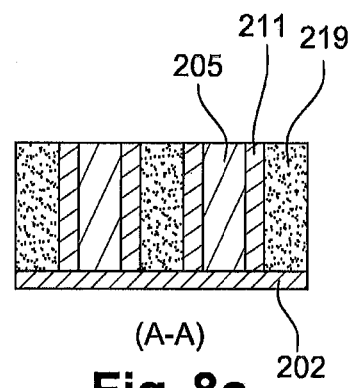
Figure 8B:
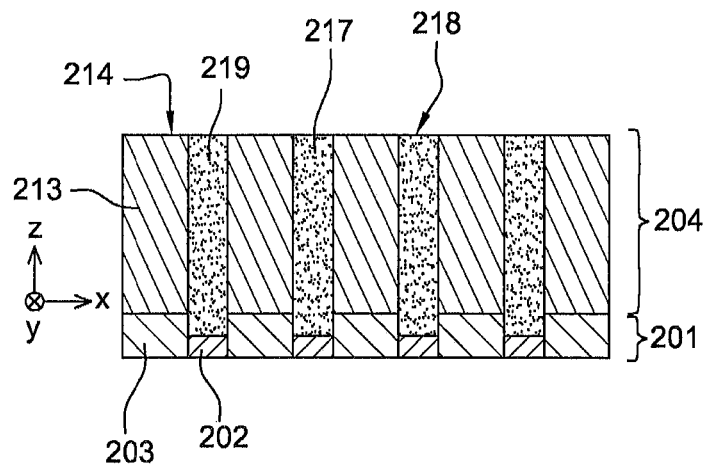
Figure 8D:
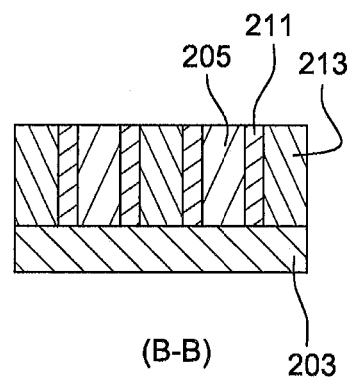
Figure 12A:
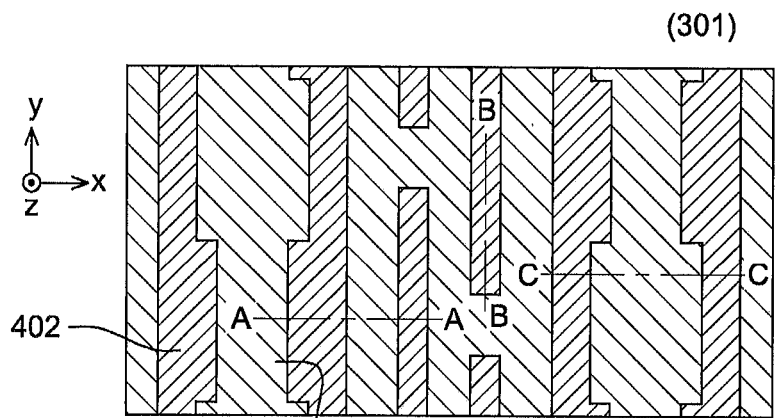
FIGS. 12a, 12b, 12c, 12d represent, respectively in top view and cross sectional view, the first step of a is method according to the invention enabling a static memory (SRAM) presenting a technology node of 11 nm to be manufactured.
Figure 12B:
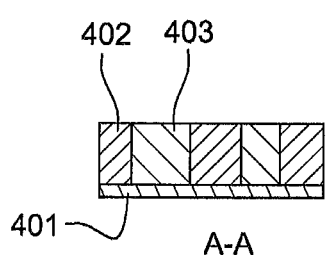
Figure 12C:
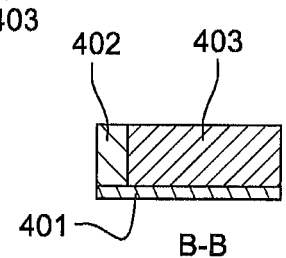
Figure 12D:
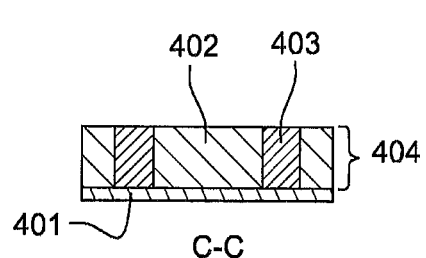
Figure 13A:
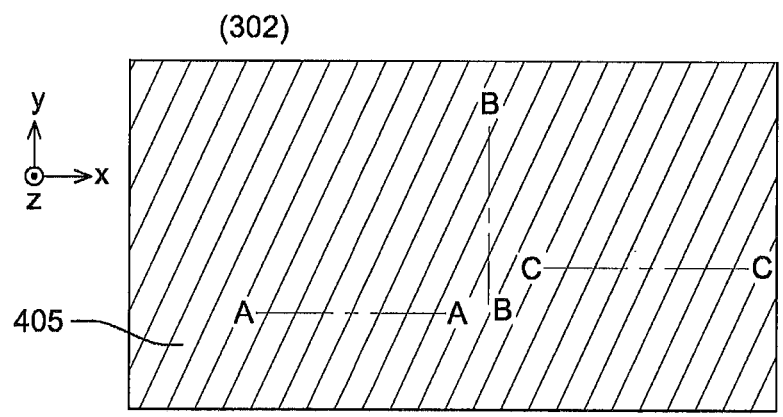
Figure 13B:
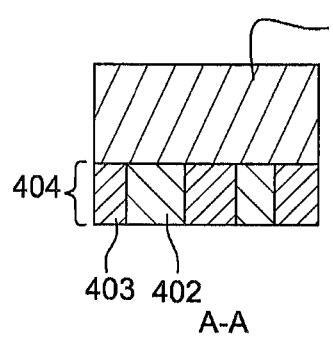
Figure 13C:
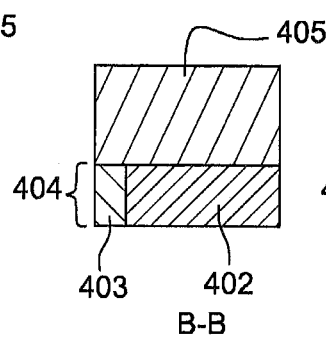
Figure 13D:
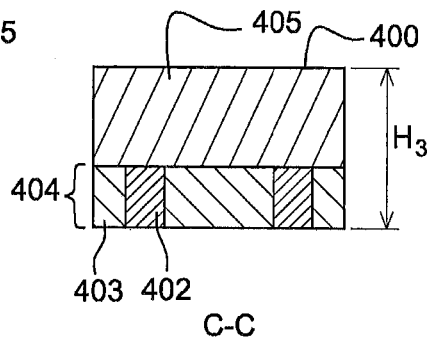

As may be seen in top view in FIG. 6b, each trench 216 is separated into several cavities 217 by insulating spacers 211 that traverse these trenches 216. Each cavity 217 presents a rectangular section along the Z axis. The method according to the invention is therefore particularly advantageous in that the cavities 217 defined in step 105 are self-aligned with relation to gate zones 205 and to insulating spacers 211, since the insulating spacers 211 define the walls of these cavities 217 along the Y axis. In addition, cavities 217 are defined along the X axis by the lateral walls of the trenches. Such being the case, the position of these lateral walls may be determined with very high accuracy (on the order of a nanometre) when the trenches are etched. The method according to the invention therefore enables cavities 217 that are very accurately positioned, and that in particular are positioned very accurately with relation to the gate zones, to be produced.

The method according to the invention then comprises a step 106, represented in FIGS. 8a to 8d, of filling cavities 217 with one or more materials making up the contacts 218 on active zones. These active zone contacts enable the active zones 202 to be electrically connected with components situated outside the integrated circuit. The material or materials making up active zone contacts 218 may be any metal or metals usually used to produce source and drain contacts in transistors from the prior art.

Therefore, active zone contacts 218 may for example be constituted of the stack according to:
 a layer of titanium or titanium nitride;
 a metal that may for example be tungsten or copper.

The cavity 217 filling step is carried out by:
 depositing a layer of the material or materials making up the active zone contacts 218 and then
 planarizing the layer, for example by Chemical-Mechanical Polishing, with suspension at the level of the upper surface 215 of gate zones 205.

The method according to the invention is therefore particularly remarkable in that the upper surface of the active zone contacts 219 is aligned with the upper surface of the gate zones 205 produced in step 102.

The method according to the invention next comprises a step of defining the gate contacts. This gate contact definition step could also be carried out before the step of forming active zone contacts.

The method according to the invention is particularly remarkable in that some parts of the gate zones 205 produced in step 102 are used to form gate contacts.

The method according to the invention therefore comprises a step 107, represented in FIGS. 9a to 9d, of depositing a second protective mask 220. This second protective mask 220 is such that a first part 221 of each gate zone 205 is not covered by the protective mask 220, while a second part 222 of each gate zone is protected by the protective mask 220. In this embodiment, the second protective mask 220 forms a line of protection that extends along the longitudinal direction and that is therefore parallel to the Y axis. The second part 222 of each gate zone protected by the protective mask 220 forms a pad situated at the middle of each gate zone 205. The first part 221 of each gate zone 205 that is not covered by the second protective mask is constituted of two parallelepiped zones of each gate zone 205 that is found on both sides of this pad.

The method according to the invention then comprises a step 108, represented in FIGS. 10a to 10d, of selectively etching the first parts 221 of gate zones 205 that are not protected by the second protective mask 220.

These first parts of gate zones 205 are etched so as to reduce their height. The upper surface of the first part of each gate zone 205 therefore passes from a height H1 to a height H2 that is lower than H1. The first parts 221 of the gate zones 205 will subsequently make up the final gate zones of the integrated circuit.

On the contrary, the upper surfaces of the second parts of the gate, zones, that are protected by the second protective mask 220, maintain a height H1 equal to the height H1 of the upper surface of the dielectric layer 213 and to the height H1 of the upper surface of active zone contacts 219. These two gate zone parts 222 form the gate contacts. These gate contacts 222 are thus self-aligned on gate zones 221 since they are all formed from gate zones 205.

The insulating spacers 211 that protect the lateral walls of each of the gate zones 205 themselves maintain the same to height H1 during this step 108.

The method according to the invention then comprises a step 109, represented in FIGS. 11a to 11d, of eliminating the second protective mask 220 by selective etching, and then a step of depositing an insulating dielectric layer 223 on the first parts of the gate zones 221 whose height was reduced, so as to close the gap left open between the upper surface of each first part of the gate zones and the upper surface of the insulating spacers 211.

The insulating dielectric layer 223 is then planarized such that its upper surface 224 is aligned with the upper surface of the dielectric layer 213 and with the upper surfaces of active zone contacts 219 and gate contacts 222. The insulating dielectric layer 223 thus fills the space that was previously occupied by the gate zones from height H2 to height H1.

The insulating dielectric layer 223 may be made of any insulating material, for example silica $SiO_2$ or nitride.

At the end of this step, gate contacts 222 are thus constituted of the parts of the gate zones whose height has not been lowered, while the final gate zones are constituted of the parts 223 of gate zones 205 whose height was lowered to reach a height H2 that is the height of the gate zones usually present in transistors from the prior art.

FIGS. 12a to 22d represent a method according to another embodiment of the invention that enables an integrated circuit of the static memory (or SRAM: "Static Random Access Memory") type in conformance with a technology node of 11 nm to be produced.

This method comprises a first step 301 of producing active zones 402 on a substrate 401 (FIGS. 12a to 12d). These active zones 402 are separated from each other by insulating zones 403, also deposited on substrate 401. These active zones and these insulating zones form a first layer 404.

Starting from a silicon substrate, the steps enabling the active zones 402 and the insulating zones 403 to be produced are for example the following:
 an oxide layer is deposited on the substrate;
 a nitride layer is deposited on the oxide layer;
 trenches presenting the form of insulating zones are defined through these oxide and nitride layers, as well as in the upper surface of the substrate. The defining of etching zones may be carried out for example by conventional lithography, by double patterning or by spacer patterning;
 these trenches are filled with the material or materials making up the insulating zones;
 the upper surface of the insulating zones is planarized, for example by Chemical-Mechanical Polishing;
 the nitride layer is removed.

The active zones 402 and insulating zones 403 form a first layer 404 on the surface of the substrate.

The method then comprises a step 302 of depositing a gate stack 405 on the first layer 404. This step is represented in FIGS. 13a to 13d. This gate stack 405 presents an upper surface 400 disposed at a height H3 that is equal to the height the active zone contacts and the gate contacts that will be produced subsequently will have. This gate stack is deposited uniformly on the first layer 404, such that it uniformly covers the entire first layer 404. In the case where the top of zones 402 and 403 presents different altitudes, gate stack 405 planarization steps may be carried out, for example by Chemical-Mechanical Polishing, in order to obtain a flat upper surface 400 of this stack.

The method according to the invention is suitable for both a "gate first" and "gate last" type approach.

When a "gate first" type approach is used, the gate stack 405 that is deposited is the stack that will constitute the final gate zones. The materials chosen for the gate stack 405 may therefore in this case be the following:
- a high-k type dielectric material,
- titanium nitride and
- a conductive material, for example a doped polysilicon or a metal.

When a "gate last" type approach is used, the gate stack 405 deposited in step 302 is a sacrificial stack that will be replaced subsequently by the final gate stack. The sacrificial stack chosen may for example be constituted of an oxide layer that will be used as the etching barrier layer of the gate zones and a false gate layer, for example in polysilicon or metal.

Of course, these materials are given for indicative purposes only and any other material usually chosen to make the gate stack may be used here.

Figure 14A:
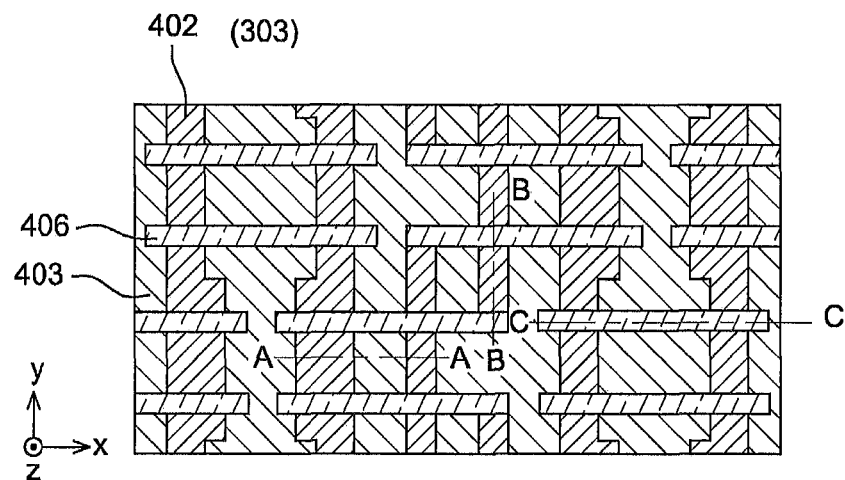
Figure 14B:
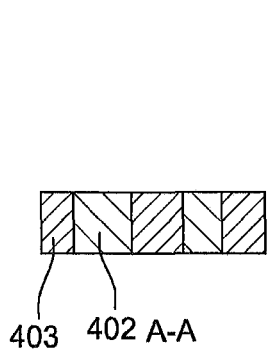
Figure 14C:
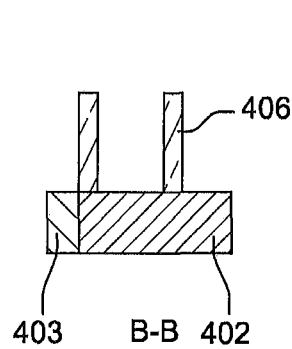
Figure 14D:
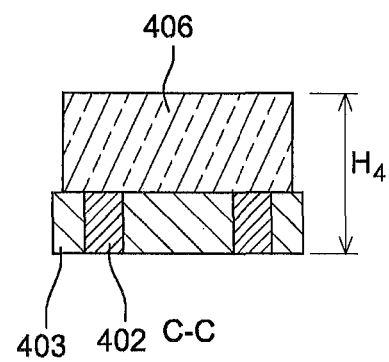
Figure 15A:
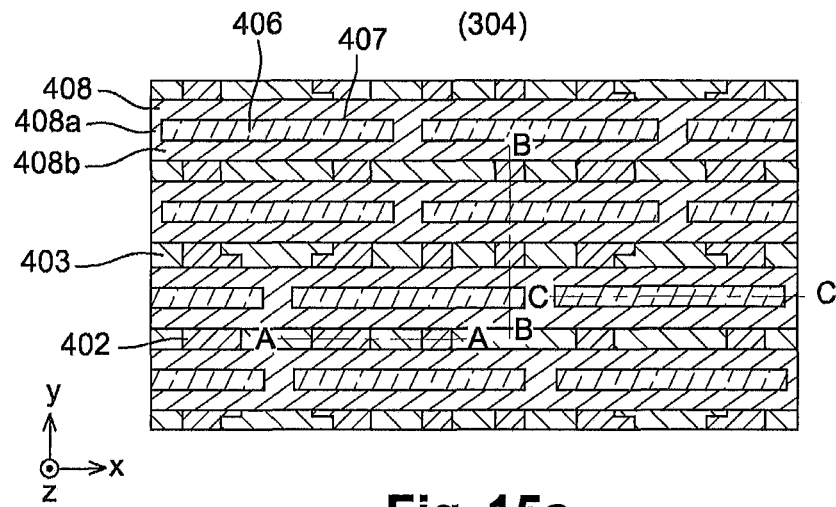
Figure 15B:
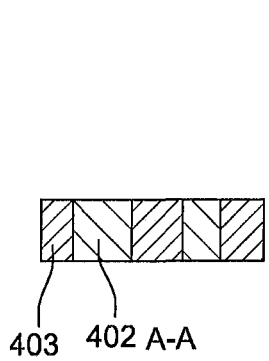
Figure 15C:
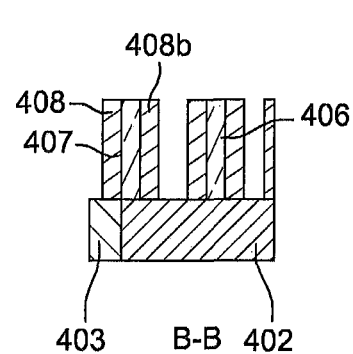
Figure 15D:
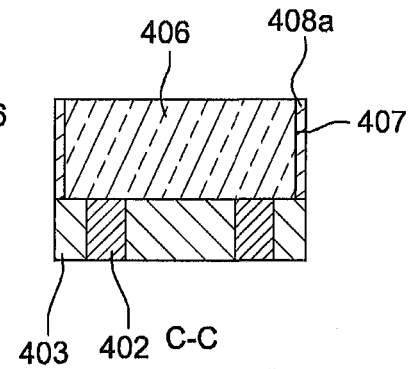
Figure 16A:
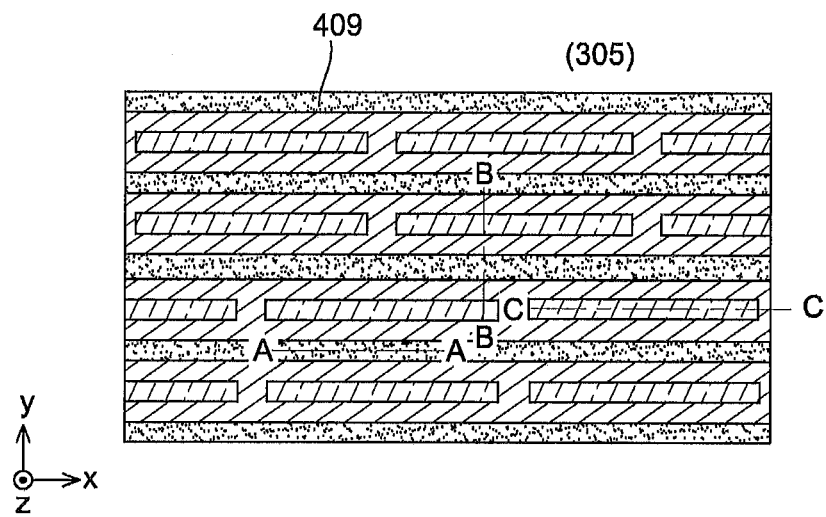
Figure 16B:
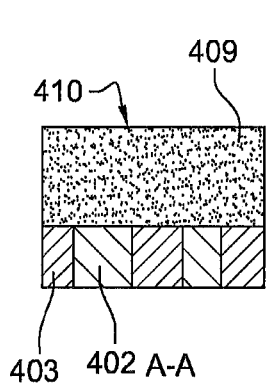
Figure 16C:
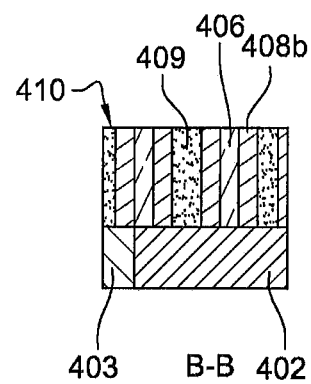
Figure 16D:
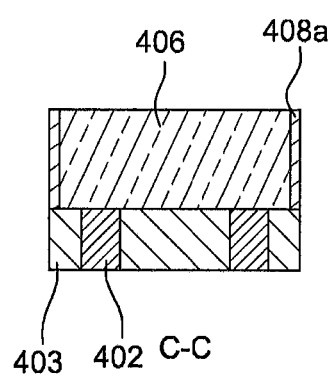
Figure 17A:
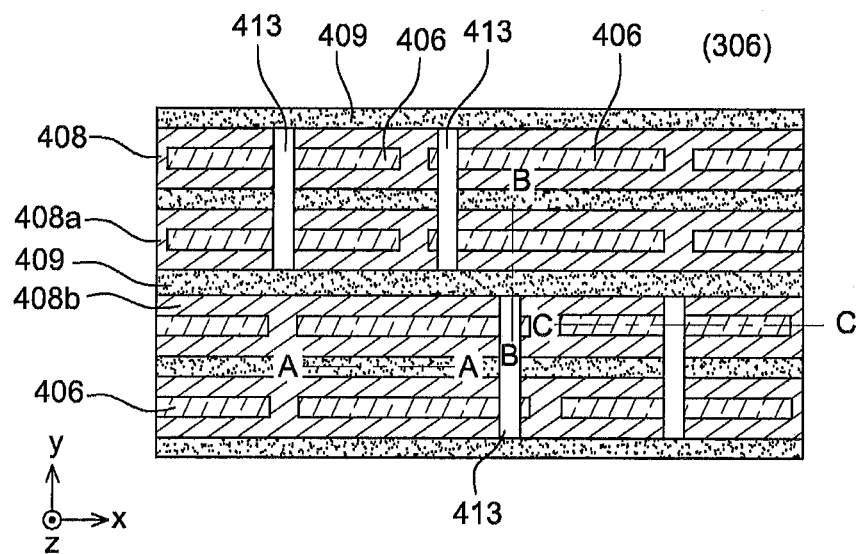
Figure 17B:
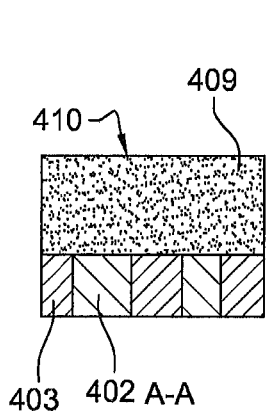
Figure 17C:
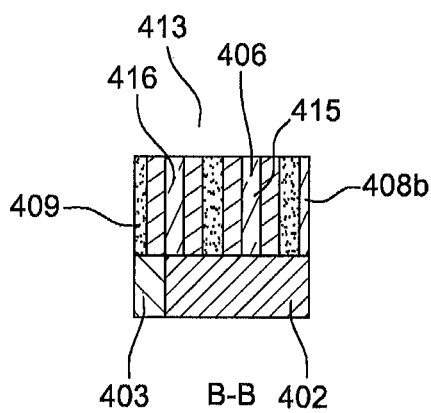
Figure 17D:
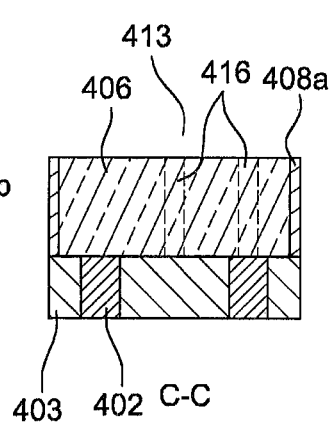
Figure 18A:
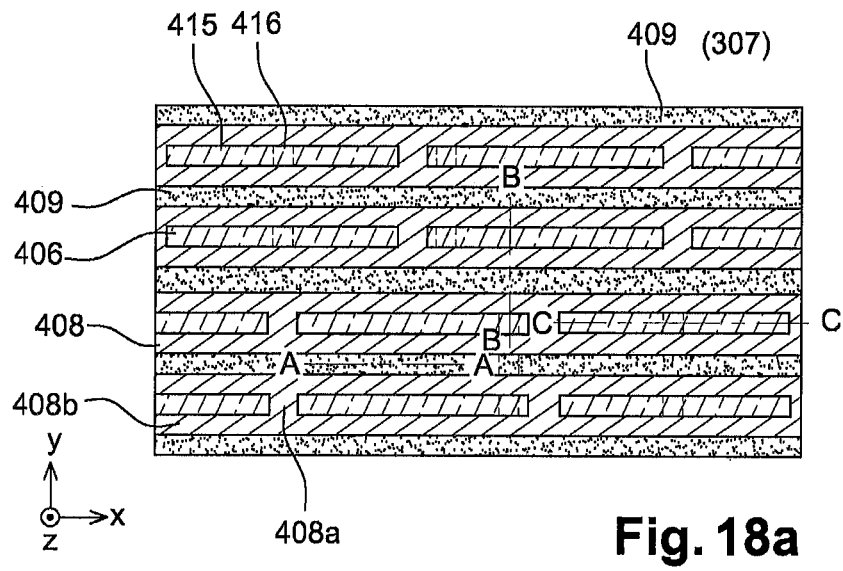
Figure 18B:
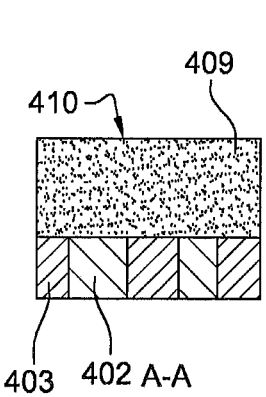
Figure 18C:
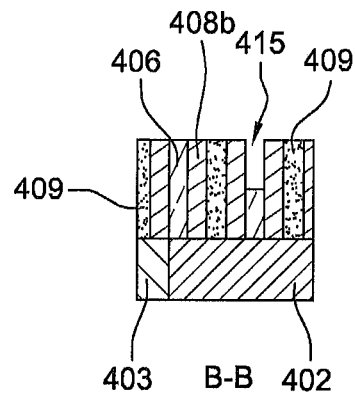
Figure 18D:
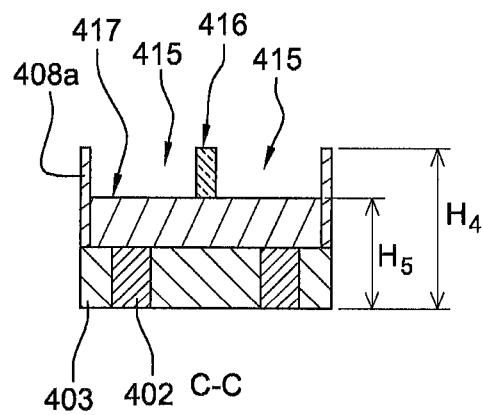
Figure 19A:
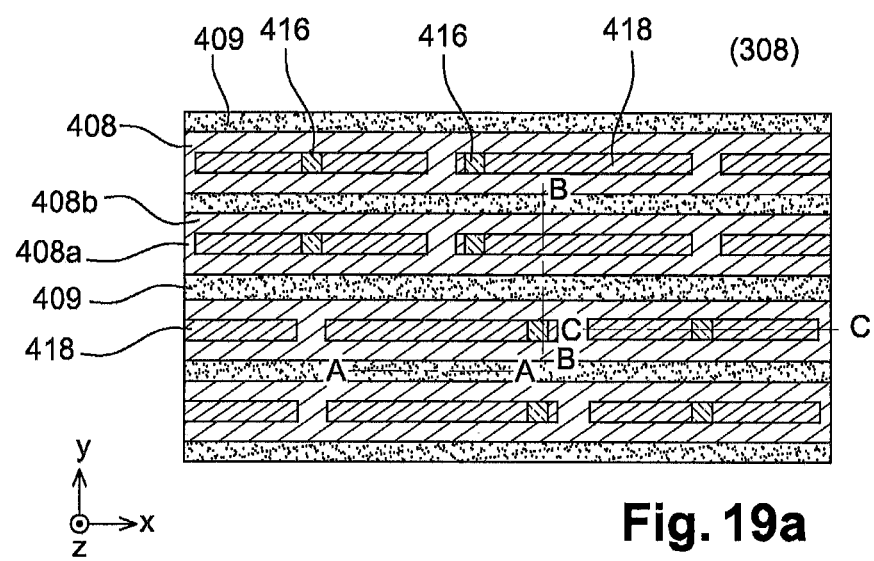
Figure 19B:
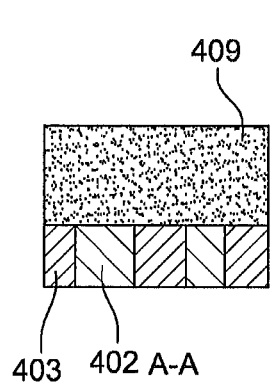
Figure 19C:
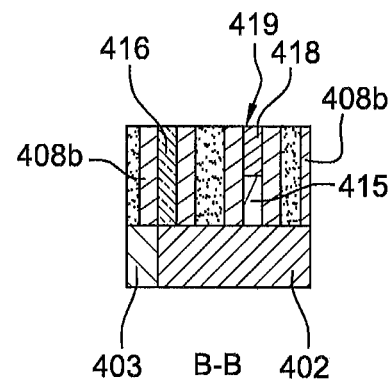
Figure 19D:
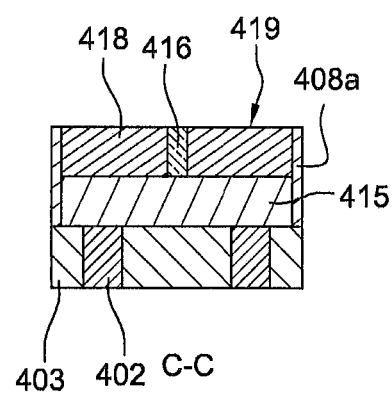
Figure 20A:
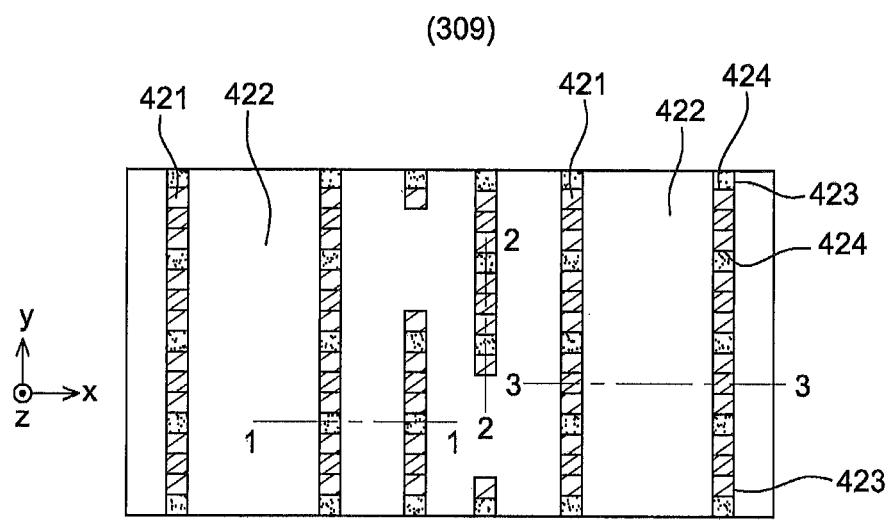
Figure 20B:
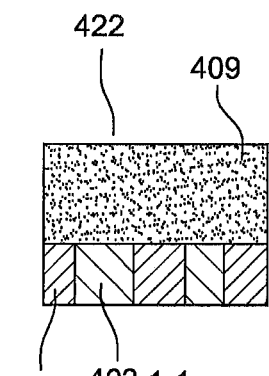
Figure 20C:
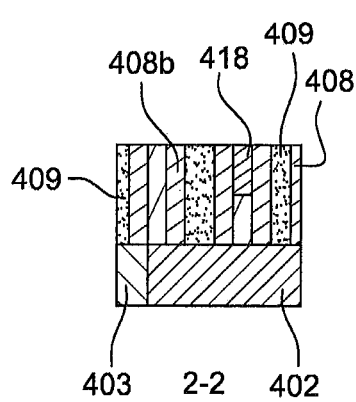
Figure 20D:
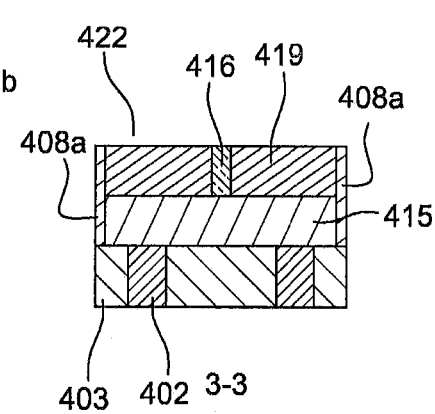

The method then comprises a step 303 of defining gate zones 406 in the gate stack 405. This step is represented in FIGS. 14a to 14b. To do this, various techniques may be used depending on the size of the technology nodes to be produced. For example, conventional, optical or electronic lithography, or spacer patterning or double patterning may be used.

The gate zones 406 made in step 303 present upper surfaces that are situated at the same height H4 as that at which the upper surfaces of gate contacts and active zone contacts will be situated.

Gate zones 406 form lines that extend along the transverse direction, parallel to the X axis. Each gate zone comprises two lateral walls 407a that extend along the longitudinal direction and two lateral walls 407b that extend along the transverse direction.

The method then comprises a step 304 of producing insulating spacers 408 that surround the lateral walls of each gate zone 405. This step is represented in FIGS. 14a to 14d. The steps used to produce these insulating spacers 408 are known from the prior art.

One may for example deposit a first insulating material layer, for example nitride, and then carry out anisotropic etching so as to define a first part of the insulating spacers 408 that surround the gate zones. The method according to the invention may then comprise a step of lithography and extension and pocket implantation and activation. These extensions and these pockets are doped zones that form the transition between the electrodes on active zones and the transistor channel.

The method according to the invention then comprises a step of depositing a second layer in insulating material, for example an oxide/nitride bilayer, and then a step of anisotropic etching so as to produce the second part of insulating spacers 408. The insulating spacers thus defined completely surround the gate zones and present upper surfaces that are aligned with the upper surfaces of the gate zones.

The method according to the invention may then comprise a step of doping the active zones, as well as a step during which the active zones are grown.

The active zones 402 are then preferably silicided so as to reduce the resistance of these zones. Siliconizing is known from the prior art. Siliconizing corresponds to the metallization of active zones 402 by chemical reaction between the silicon that makes up the active zones 402 and a metal (for example nickel) so as to form areas of low resistivity. The siliconizing of active zones 402 may also be carried out subsequently.

The method then comprises a step 305, represented in FIGS. 15a to 15d, of depositing a dielectric layer 409 so as to fill the space between the insulating spacers 408a and 408b. The dielectric layer 409 may, for example, be constituted of silica $SiO_2$.

The upper surface 410 of this dielectric layer 409 is then planarized, for example by Chemical-Mechanical Polishing, such that the upper surface 410 of the dielectric layer is level with the upper surface 411 of the gate zones 406.

When a "gate last" type approach has been chosen, the method comprises, at this stage, a step of replacing the sacrificial stack that would provisionally constitute the gate zones with the final stack that will constitute the final gate zones.

The method according to the invention then comprises a step of producing gate contacts that is represented in FIGS. 17a to 19d.

To do this, the method comprises a step 306 during which a first part 415 of each gate zone 406 is uncovered, while a second part 416 of each gate zone is covered by a second protective mask 413. The second protective mask 413 comprises several patterns 414 that each form a line that extends along the longitudinal direction parallel to the Y axis. These patterns 414 each cross several gate zones 406. The second parts 416 that are covered by the second protective mask 413 each form pads of rectangular section along the Z axis.

The method then comprises a step 307, represented in FIGS. 18a to 18d, of etching the first parts 415 of gate zones 406 that are not protected by the protective mask 413 so as to lower the height of their upper surfaces 417. The first parts 415 of the gate zones not protected by the protective mask present, following this step 307, upper surfaces that are at a height H5 that is lower than the height of the upper surfaces H4 that the gate zones 406 had prior to step 307. To do this, the gate zones 415 not protected by the second protective mask are for example partially etched. The step of partially etching the gate zones may be controlled thanks to the etching time or the etching of the upper layer of the gate stack may constitute the gate zones. This partial etching step is selective with relation to the other materials present, i.e., only the second parts of the gate zones are partially etched. During this step, the insulating spacers, dielectric layer, protective mask and second parts 416 of the gate zones maintain the upper surfaces at a height H4.

Once the first parts 415 of the gate zones have been etched, the second protective mask 413 is eliminated by etching.

Gate zones 406 are then obtained that each present at least:
- a first part 415 in which the upper surface is at a lower level than the upper surface of the other elements of the integrated circuit. This first part 415 will subsequently play the role of final gate zone;
- a second part 416 in the form of a pad of rectangular section, that presents an upper surface level with the upper surfaces of other elements of the integrated circuit. This second part 416 will form the gate contact.

Therefore, the invention is particularly remarkable in that the gate contacts 416 and the final gate zones 415 are formed from gate zones 406 and thus the gate contacts 416 and the final gate zones 415 are automatically aligned. In addition, according to the invention, the gate contacts 416 form lines and not holes, contrary to methods from the prior art.

The method then comprises a step of depositing an insulation layer 418 on the first parts 415 of the gate zones 406 so as to close the gap of the gate zones that was released in step 307. To do this, the insulation layer 418 is deposited, and then its upper surface 419 is polished, for example by Chemical-Mechanical Polishing, such that it is level with the upper surfaces of the dielectric layer 409, insulating spacers 408 and gate contacts 416. This insulation layer 418 is preferably made in a dielectric material that is different from the dielectric material of dielectric layer 409. This insulation layer 418 is for example made of nitride or in an oxide/nitride bilayer when the dielectric layer 409 is made of silica. This insulation layer 418 enables the final gate zones 415 to be isolated. The gate contacts 416 traverse the insulation layer.

The method according to the invention then comprises a step is of producing active zone contacts 420 through the dielectric layer 409 so as to enable an electrical connection between the active zones and components outside of the integrated circuit.

To do this, the method first of all comprises a step of producing trenches 421 in the dielectric layer 409. This step is represented in FIGS. 20a to 21d.

To dig these trenches 421, a mask 422 may for example be deposited on the dielectric layer 409 in step 309. This mask 422 defines the form of the trenches 420 to dig. This mask 422 defines lines that extend along the longitudinal direction, parallel to the X axis.

During step 310, represented in FIGS. 21a to 21d, the dielectric layer 409 is etched such that the upper surface of the active zones 402 is accessible through the dielectric layer 409 thanks to the trenches 421. This etching step is selective, i.e., only part of the dielectric layer is removed. The insulating spacers, insulation layer and gate zones remain intact during this step.

Mask 422 is then eliminated by selective etching.

Trenches 421 may be made by other methods, for example by spacer patterning or double patterning.

Figure 21A:
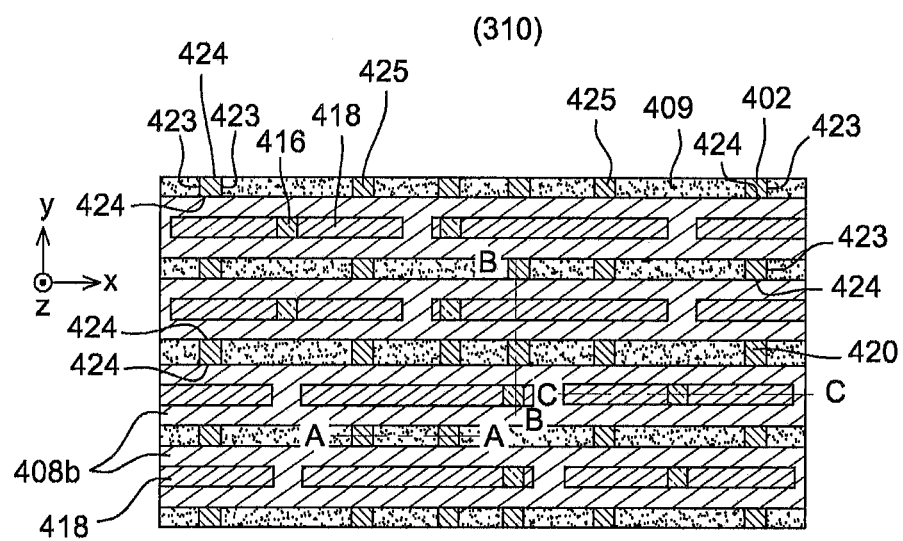
Figure 21B:
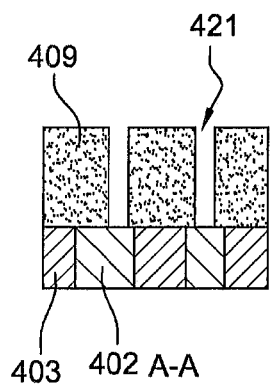
Figure 21C:
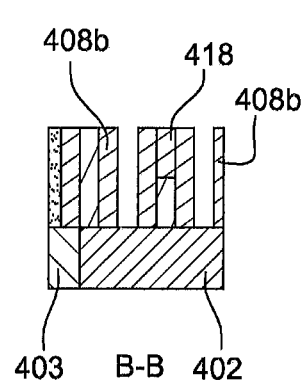
Figure 21D:
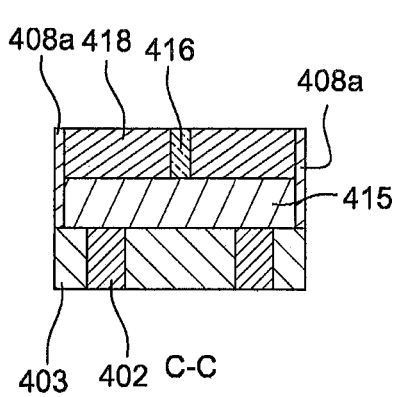
Figure 22A:
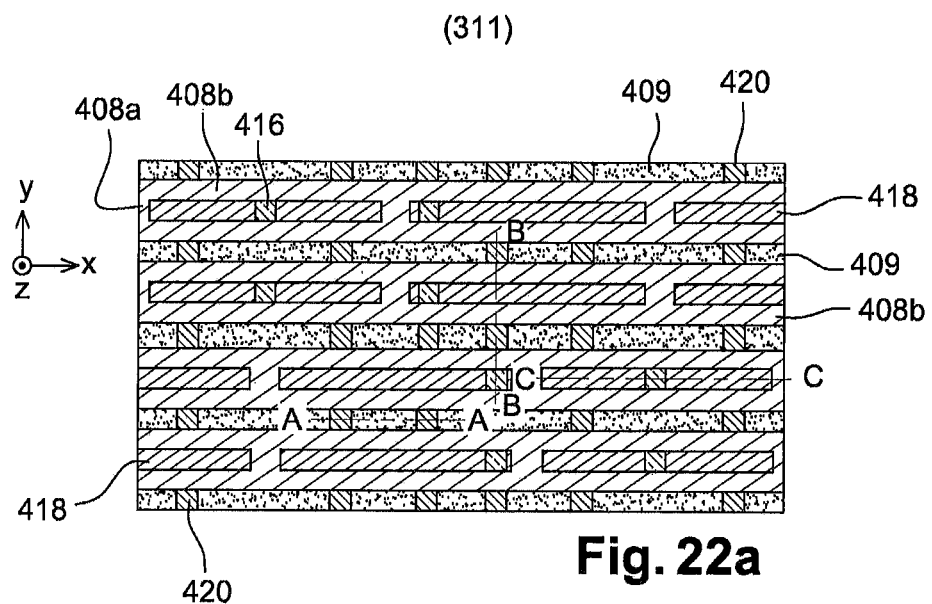
Figure 22B:
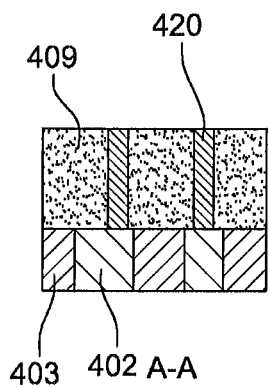
Figure 22C:
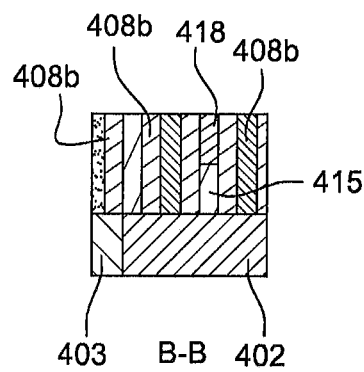
Figure 22D:
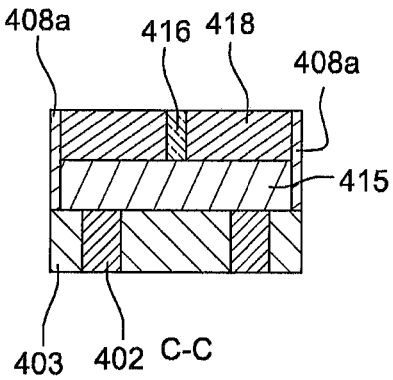

The result obtained at the end of this step is represented in FIGS. 21a and 21b.

Each trench 421 is traversed by gate zones 406 surrounded by insulating spacers 408 that extend along the transverse direction. Therefore, the lateral walls 423 of trenches 421, that extend along the longitudinal direction, and the lateral walls 424 of spacers 408, that extend along the transverse direction, define cavities 425 of rectangular section along the Z axis. These cavities 425 are self-aligned on gate zones 406 and insulating spacers 408, since the insulating spacers 408 define two of the cavity 425 walls.

The method then comprises a step 311, represented in FIGS. 22a to 22d, of filling cavities 425 with one or more materials making up the active zone 420 contacts. The active zone contacts 420 enable the active zones 402 to be electrically connected with a current source situated outside of the integrated circuit. Cavities 425 may for example be filled with a layer of titanium or titanium nitride, and then a layer of tungsten or copper. The upper surface of the layers deposited in cavities 425 is then planarized, for example by Chemical-Mechanical Polishing, such that the upper surface of the active zone 420 contacts is level with the upper surface of the gate contacts, and the upper surface of the dielectric layer.

The methods according to the invention therefore enable integrated circuits to be obtained that comprise transistors particularly equipped with active zones, gate zones and active zone contacts and gate contacts in which the active zone contacts and gate contacts are perfectly aligned with the gate zones, even when the integrated circuits produced are in conformance with technology nodes of less than or equal to 22 nm.

Naturally, the steps described with reference to the figures are given for illustrative purposes only and variations may be contemplated. In particular, the materials given above are given for illustrative purposes only and other materials may be used by the person skilled in the art without departing from the scope of the invention. In addition, the printed circuit geometries described above are described for illustrative purposes only and other geometries may be produced with the method according to the invention without departing from the scope of the invention.

The invention claimed is:

1. A method of producing an integrated circuit on a surface of a substrate comprising:
   (a) producing a first layer comprising active zones and insulating zones on the surface of the substrate;
   (b) producing gate zones on the surface of the first layer, the gate zones presenting upper surfaces substantially at the same level;
   (c) producing insulating spacers that surround each of the gate zones, the insulating spacers presenting upper surfaces level with the upper surfaces of the gate zones;
   (d) producing a dielectric layer between the insulating spacers, the dielectric layer presenting an upper surface level with the upper surfaces of the gate zones produced in (b);
   (e) partially etching each gate zone so as to lower the upper surface of a first part of each gate zone, a second part of each gate zone maintaining the level of its upper surface, the second part of each gate zone forming a gate contact;
   (f) depositing an insulating dielectric layer on the first parts of the gate zones.

2. The method according to the claim 1, comprising:
   (g) selectively etching the dielectric layer so as to form trenches in the dielectric layer, the trenches being situated over the active zones;
   (h) filling the trenches with a conductive material so as to produce contacts on active zones.

3. The method according to claim 2, wherein (g) and (h) are carried out before (e) and (f).

4. The method according to claim 2, wherein (e) and (f) are carried out before (g) and (h).

5. The method according to claim 1, wherein the active zones and the insulating zones extend along a longitudinal direction, the gate zones extending along a transverse direction perpendicular to the longitudinal direction.

6. The method according to claim 5, wherein (e) comprises:
   depositing a second protective mask that defines lines of protection extending along the longitudinal direction, the lines of protection protecting the second parts of the gate zones;
   partially etching the gate zones through the second protective mask so as to lower the height of the first parts of the gate zones that are not protected by the lines of protection,
   removing the second protective mask.

7. The method according to claim 2, wherein the trenches produced in (g) each comprise two lateral walls extending along a longitudinal direction, wherein the active zones and the insulating zones extend along said longitudinal direction, each active zone contact being delimited by the lateral walls of one of the trenches and by the insulating spacers.

8. The method according to claim 1, wherein (d) comprises:
   depositing a dielectric layer;
   polishing the dielectric layer such that the upper surface is level with the upper surfaces of the gate zones.

9. The method according to claim 1, comprising producing electrodes on the active zones.

10. The method according to claim 1, wherein the upper surface of the insulating dielectric layer is level with the upper surface of the dielectric layer.

11. The method according to claim 1, wherein the insulating dielectric layer is made of a dielectric material that is different from the dielectric material of which the dielectric layer is made.

12. The method according to claim 1, wherein the gate zones are produced in a sacrificial stack, the method comprising, following (d), replacing the sacrificial stack with a final gate stack.

* * * * *